(12) United States Patent
Hu et al.

(10) Patent No.: US 12,184,263 B2
(45) Date of Patent: Dec. 31, 2024

(54) BULK ACOUSTIC WAVE RESONATOR AND METHOD FOR MANUFACTURING THE SAME

(71) Applicant: Shenzhen Newsonic Technologies Co., Ltd., Guangdong (CN)

(72) Inventors: Weiwei Hu, Guangdong (CN); Jie Zou, Guangdong (CN); Gongbin Tang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/422,383

(22) Filed: Jan. 25, 2024

(65) Prior Publication Data

US 2024/0204746 A1    Jun. 20, 2024

(30) Foreign Application Priority Data

Nov. 29, 2023   (CN) .......................... 202311604926.7

(51) Int. Cl.
| | | |
|---|---|---|
| *H03H 9/10* | (2006.01) | |
| *H03H 3/02* | (2006.01) | |
| *H03H 9/05* | (2006.01) | |
| *H03H 9/17* | (2006.01) | |

(52) U.S. Cl.
CPC .............. *H03H 9/105* (2013.01); *H03H 3/02* (2013.01); *H03H 9/0523* (2013.01); *H03H 9/173* (2013.01); *H03H 2003/021* (2013.01)

(58) Field of Classification Search
CPC ........ H03H 9/05; H03H 9/0523; H03H 9/173; H03H 3/02; H03H 2003/021
See application file for complete search history.

(56) References Cited

U.S. PATENT DOCUMENTS

| | | | |
|---|---|---|---|
| 2004/0032012 A1* | 2/2004 | Wong ................. | H03H 9/105 |
| | | | 257/E21.499 |
| 2021/0184645 A1* | 6/2021 | Luo ................... | H03H 9/1014 |
| 2023/0006644 A1* | 1/2023 | Huang ................ | H03H 9/174 |
| 2023/0097870 A1* | 3/2023 | Weng ................ | H01L 21/02057 |
| | | | 310/365 |
| 2023/0308073 A1* | 9/2023 | Ding ................. | H03H 9/0523 |
| 2023/0336149 A1* | 10/2023 | Li ..................... | H03H 9/564 |
| 2023/0353118 A1* | 11/2023 | Huang .............. | H03H 9/1035 |

* cited by examiner

*Primary Examiner* — J. San Martin
(74) *Attorney, Agent, or Firm* — Leason Ellis LLP

(57) ABSTRACT

A bulk acoustic wave resonator and method for manufacturing the same, the bulk acoustic wave resonator includes: a piezoelectric layer; a first electrode layer, a carrier structure, and first and second conductive connectors disposed on a first side of the piezoelectric layer, and a second electrode layer, an interconnection pad and a cover structure disposed on a second side of the piezoelectric layer, wherein the first electrode layer includes a first electrode and an additional electrode electrically isolated from each other; the second electrode layer includes a second electrode; the interconnection pad is electrically connected to the second electrode and the additional electrode; a first cavity is disposed between the carrier structure and the piezoelectric layer; the first conductive connector is electrically connected to the first electrode, the second conductive connector is electrically connected to the second electrode through the additional electrode and the interconnection pad.

20 Claims, 10 Drawing Sheets

BULK ACOUSTIC WAVE RESONATOR AND METHOD FOR MANUFACTURING THE SAME

CROSS-REFERENCE TO RELATED APPLICATION(S)

The application claims priority to the Chinese patent application No. 202311604926.7, filed on Nov. 29, 2023, the entire disclosure of which is incorporated herein by reference as part of the present application.

TECHNICAL FIELD

Embodiments of the present disclosure relate to a bulk acoustic wave resonator and a method for manufacturing the same.

BACKGROUND

With the rapid development of mobile communication technology, filters based on resonators are more and more widely used in communication devices such as smart phones and the like. A film bulk acoustic wave resonator (FBAR) generally includes an upper electrode, a piezoelectric layer and a lower electrode; a conductive pad and a cover structure are disposed on a side of the piezoelectric layer and the upper electrode away from the lower electrode; and the cover structure and the piezoelectric layer surround and delimit an upper cavity. For a traditional bulk acoustic wave resonator, in general, the cover structure is bonded with the piezoelectric layer, the conductive pad and other components by using a dry film as a bonding layer; and conductive bumps are disposed at a side where the cover structure is located, and is electrically connected to a corresponding electrode through the conductive pad. However, an adhesion between the bonding layer of the cover structure and part of the components (for example, the conductive pad) bonded to the bonding layer may be poor. For example, in a subsequent process, the dry film may undergo a deformation such as expansion or contraction, and delamination may be occurred between the dry film and the conductive pad that is bonded to the dry film, which may lead to reliability problems of the resonator, such as frequency deviation, bump fracture, or the like.

SUMMARY

At least one embodiment of the present disclosure provides a bulk acoustic wave resonator, including: a piezoelectric layer, having a first side and a second side opposite to each other in a first direction; a first electrode layer, disposed on the first side of the piezoelectric layer and including a first electrode and an additional electrode electrically isolated from each other; a second electrode layer, disposed on the second side of the piezoelectric layer and including a second electrode; one or more conductive pads, disposed on the second side of the piezoelectric layer and at least including an interconnection pad, wherein the interconnection pad is electrically connected to the second electrode and extends through the second electrode and the piezoelectric layer to be electrically connected to the additional electrode; a carrier structure, disposed on a side of the piezoelectric layer and the first electrode layer away from the second electrode layer, wherein a first cavity is disposed between the carrier structure and the piezoelectric layer, and a portion of the first electrode is located in the first cavity; a cover structure, disposed on the second side of the piezoelectric layer and including a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; and a first conductive connector and a second conductive connector, disposed on the first side of the piezoelectric layer away from the cover structure, wherein the first conductive connector extends through the carrier structure to be electrically connected to the first electrode, wherein the second conductive connector extends through the carrier structure to be electrically connected to the additional electrode, and further electrically connected to the second electrode through the additional electrode and the interconnection pad.

In the bulk acoustic wave resonator provided by at least one embodiment of the present disclosure, the second electrode has an electrode via hole, the piezoelectric layer has an additional piezoelectric via hole, and the electrode via hole and the additional piezoelectric via hole are in spatial communication with each other to expose a portion of a surface of the additional electrode at a side close to the piezoelectric layer, and the interconnection pad is electrically connected to the additional electrode through the electrode via hole and the additional piezoelectric via hole.

In the bulk acoustic wave resonator provided by at least one embodiment of the present disclosure, the one or more conductive pads further include at least one of a first conductive pad and a second conductive pad; the first conductive pad is disposed on a surface of the second side of the piezoelectric layer and electrically connected to the first electrode through a piezoelectric via hole in the piezoelectric layer; and the second conductive pad is disposed on a side of the second electrode away from the piezoelectric layer and electrically connected to the second electrode.

In the bulk acoustic wave resonator provided by at least one embodiment of the present disclosure, the first conductive pad and the second conductive pad are used as test pads.

In the bulk acoustic wave resonator provided by at least one embodiment of the present disclosure, the cover bonding layer is bonded to portions of surfaces of the piezoelectric layer and the one or more conductive pads, and part of the one or more conductive pads has an embedded portion, the embedded portion is covered by the cover bonding layer, and a contact area between the embedded portion and the cover bonding layer is greater than or equal to an area of a surface of the embedded portion at a side away from the piezoelectric layer.

In the bulk acoustic wave resonator provided by at least one embodiment of the present disclosure, there is free of a conductive component disposed in the cover bonding layer and electrically connected to the embedded portion of the part of the one or more conductive pads.

In the bulk acoustic wave resonator provided by at least one embodiment of the present disclosure, a portion of the carrier structure is located between the first electrode and the additional electrode in a second direction parallel to a main surface of the piezoelectric layer, and the additional electrode is located on a side of the portion of the carrier structure away from the first cavity in the second direction and is spaced apart from the first cavity.

In the bulk acoustic wave resonator provided by at least one embodiment of the present disclosure, the carrier structure includes: a supporting dielectric layer, disposed on a side of the first electrode layer away from the piezoelectric layer, and a portion of the supporting dielectric layer is located between the first electrode and the additional electrode in a second direction parallel to a main surface of the piezoelectric layer; a carrier bonding layer, disposed on a side of the supporting dielectric layer away from the piezoelectric layer; a cavity boundary layer, located between the supporting dielectric layer and the carrier bonding layer, and located on a side of the carrier bonding layer close to the first cavity, wherein the cavity boundary layer delimits a portion of a boundary of the first cavity; and a carrier substrate, located on a side of the carrier bonding layer away from the piezoelectric layer.

In the bulk acoustic wave resonator provided by at least one embodiment of the present disclosure, a portion of the supporting dielectric layer and a portion of the carrier bonding layer are spaced apart from each other by the cavity boundary layer; and the supporting dielectric layer and the carrier bonding layer have portions that are in contact with each other.

In the bulk acoustic wave resonator provided by at least one embodiment of the present disclosure, the carrier substrate and the portions that are in contact with each other of the supporting dielectric layer and the carrier bonding layer have a first connection via hole and a second connection via hole disposed therein; and the first conductive connector is electrically connected to the first electrode through the first connection via hole, and the second conductive connector is electrically connected to the additional electrode through the second connection via hole.

In the bulk acoustic wave resonator provided by at least one embodiment of the present disclosure, the supporting dielectric layer includes: a first dielectric part, located between the first electrode and the carrier bonding layer in the first direction; and a second dielectric part, located between the additional electrode and the carrier bonding layer in the first direction, wherein a thickness of the second dielectric part in the first direction is greater than a thickness of the first dielectric part in the first direction.

The bulk acoustic wave resonator provided by at least one embodiment of the present disclosure further includes a passivation layer, wherein a portion of the passivation layer is located between the first electrode and the first dielectric part, and the first electrode is spaced apart from the first dielectric part by the passivation layer, wherein the additional electrode is in direct contact with the second dielectric part.

In the bulk acoustic wave resonator provided by at least one embodiment of the present disclosure, an orthographic projection of the first conductive connector and an orthographic projection of the second conductive connector on the piezoelectric layer are offset from an orthographic projection of the cavity boundary layer on the piezoelectric layer.

In the bulk acoustic wave resonator provided by at least one embodiment of the present disclosure, the carrier bonding layer includes: a bonding body, located on a side of the supporting dielectric layer away from the piezoelectric layer in the first direction; and a bonding protrusion, protruded in the first direction, from a surface of the bonding body at a side away from the carrier substrate towards the piezoelectric layer, wherein the first cavity is surrounded by the bonding protrusion, and the bonding body includes a first body part and a second body part; an orthographic projection of the first body part on the main surface of the piezoelectric layer overlaps with an orthographic projection of the first cavity on the main surface of the piezoelectric layer, and the second body part is located on a side of the bonding protrusion away from the first cavity in the second direction.

In the bulk acoustic wave resonator provided by at least one embodiment of the present disclosure, the cavity boundary layer covers a sidewall of the bonding protrusion and surfaces of the bonding protrusion and the first body part at a side close to the piezoelectric layer, and the bonding protrusion is spaced apart from the supporting dielectric layer by the cavity boundary layer.

In the bulk acoustic wave resonator provided by at least one embodiment of the present disclosure, the supporting dielectric layer is located on a side of the bonding protrusion and a portion of the cavity boundary layer covering the bonding protrusion away from the first cavity in a direction parallel to the main surface of the piezoelectric layer, and the supporting dielectric layer is in contact with the second body part.

In the bulk acoustic wave resonator provided by at least one embodiment of the present disclosure, a material of the carrier bonding layer is different from a material of the cover bonding layer.

In the bulk acoustic wave resonator provided by at least one embodiment of the present disclosure, the carrier bonding layer includes an inorganic material, and the cover bonding layer includes an organic material.

In the bulk acoustic wave resonator provided by at least one embodiment of the present disclosure, the first conductive connector includes a first conductive via and a first conductive bump connected with each other, and the second conductive connector includes a second conductive via and a second conductive bump connected with each other; at least a portion of the first conductive via and at least a portion of the second conductive via are embedded in the carrier structure; the first conductive bump is electrically connected to the first electrode through the first conductive via, and the second conductive bump is electrically connected to the additional electrode through the second conductive via.

At one embodiment of the present disclosure provides a method for manufacturing a bulk acoustic wave resonator, including: sequentially forming a second electrode layer, a piezoelectric layer and a first electrode layer, wherein the first electrode layer and the second electrode layer are respectively located on a first side and a second side of the piezoelectric layer opposite to each other in a first direction; performing a patterning process on the first electrode layer to form a first electrode and an additional electrode, and forming a gap between the first electrode and the additional electrode, so that the first electrode and the additional electrode are spaced apart from each other and electrically isolated from each other; forming a carrier structure on a side of the piezoelectric layer and the first electrode layer away from the second electrode layer, with a portion of the carrier structure being filled in the gap, and forming a first cavity between the piezoelectric layer and the carrier structure, with a portion of the first electrode being located in the first cavity; performing a patterning process on the second electrode layer to form a second electrode; forming one or more conductive pads on the second side of the piezoelectric layer, wherein the one or more conductive pads at least include an interconnection pad, the interconnection pad is electrically connected to the second electrode, and extends through the second electrode and the piezoelectric layer to be electrically connected to the additional electrode; bonding a cover structure to the second side of the piezoelectric layer, and forming a second cavity between the cover structure and the piezoelectric layer, wherein the cover structure includes a cover bonding layer and a cover substrate, the cover bonding layer is disposed between the cover substrate and the piezoelectric layer in the first direction, and a portion of the second electrode layer is located in the second cavity; forming a first connection via hole and a second connection via hole extending through the carrier structure; and forming a first conductive connector and a second conductive connector on a side of the piezoelectric layer away from the cover structure, wherein the first conductive connector is electrically connected to the first electrode through the first connection via hole, the second conductive connector is electrically connected to the additional electrode through the second connection via hole, and the further electrically connected to the second electrode through the additional electrode and the interconnection pad.

In the method for manufacturing the bulk acoustic wave resonator provided by at least one embodiment of the present disclosure, forming the carrier structure includes: forming a dielectric layer on a side of the first electrode layer and the piezoelectric layer away from the second electrode layer, wherein the dielectric layer is filled in the gap between the first electrode and the additional electrode; performing a patterning process on the dielectric layer to form a trench in the dielectric layer, and a sacrificial dielectric layer and a supporting dielectric layer spaced apart from each other by the trench are formed; forming a cavity boundary layer on a side of the dielectric layer away from the piezoelectric layer, wherein the cavity boundary layer is filled in the trench and covers a surface of the trench; removing a portion of the cavity boundary layer located on a side of the supporting dielectric layer away from the piezoelectric layer; forming a carrier bonding layer on a side of the dielectric layer and the cavity boundary layer away from the piezoelectric layer; and bonding a carrier substrate to the carrier bonding layer.

In the method for manufacturing the bulk acoustic wave resonator provided by at least one embodiment of the present disclosure, forming the first connection via hole and the second connection via hole in the carrier structure includes: removing a portion of the carrier substrate, a portion of the carrier bonding layer and a portion of the supporting dielectric layer to form the first connection via hole and the second connection via hole in the carrier substrate, the carrier bonding layer and the supporting dielectric layer.

In the method for manufacturing the bulk acoustic wave resonator provided by at least one embodiment of the present disclosure, performing the patterning process on the second electrode layer includes forming an electrode via hole in the second electrode; after performing the patterning process on the second electrode layer and before forming the one or more conductive pads, the method further includes: removing a portion of the piezoelectric layer to form an additional piezoelectric via hole in the piezoelectric layer to expose a portion of a surface of the additional electrode, wherein the additional piezoelectric via hole is in spatial communication with the electrode via hole; the interconnection pad is electrically connected to the additional electrode through the electrode via hole and the additional piezoelectric via hole.

BRIEF DESCRIPTION OF DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1:
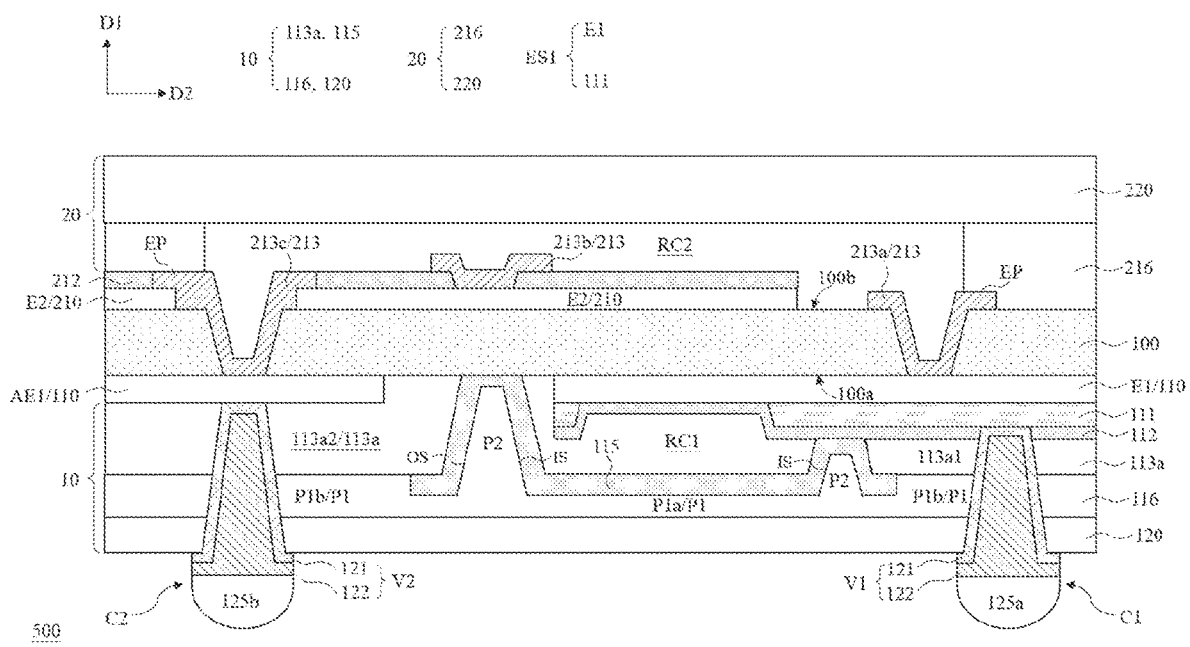
FIG. 1 illustrates a schematic cross-sectional view of a bulk acoustic wave resonator according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection" "connected", and the like are not limited to physical or mechanical connection but may include electrical connection, either directly or indirectly.

The embodiments of the disclosure provide a bulk acoustic wave resonator and a method for manufacturing the same. The bulk acoustic wave resonator includes a piezoelectric layer, a first electrode layer, a second electrode layer, one or more conductive pads, a carrier structure, a cover structure, a first conductive connector and a second conductive connector. The piezoelectric layer has a first side and a second side opposite to each other in a first direction; the first electrode layer is disposed on the first side of the piezoelectric layer and includes a first electrode and an additional electrode which are electrically isolated from each other; the second electrode layer is disposed on the second side of the piezoelectric layer and includes a second electrode; the one or more conductive pads are disposed on the second side of the piezoelectric layer and at least include an interconnection pad, the interconnection pad is electrically connected to the second electrode and extends through the second electrode and the piezoelectric layer so as to be electrically connected to the additional electrode; the carrier structure is disposed on a side of the piezoelectric layer and the first electrode layer away from the second electrode layer, wherein a first cavity is disposed between the carrier structure and the piezoelectric layer, and a portion of the first electrode is located in the first cavity; the cover structure is disposed on the second side of the piezoelectric layer and includes a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; the first conductive connector and the second conductive connector are disposed on the first side of the piezoelectric layer away from the cover structure and the one or more conductive pads, the first conductive connector extends through the carrier structure to be electrically connected to the first electrode, the second conductive connector extends through the carrier structure to be electrically connected to the additional electrode, and the second conductive connector is electrically connected to the second electrode through the additional electrode and the interconnection pad.

In the bulk acoustic wave resonator and the method for manufacturing the same provided by the embodiments of the present disclosure, at least the following technical effects are achieved: through disposing the first conductive connector and the second conductive connector on the first side of the piezoelectric layer away from the cover structure, and through disposing the additional electrode and the interconnection pad to realize the electrical connection between the second conductive connector and the second electrode located on the second side of the piezoelectric layer, adverse influences on the conductive connectors due to possible problems such as deformation and delamination of the cover bonding layer can be minimized, and an effective electrical connection between the conductive connector and the electrode can be ensured, thereby improving the reliability of the device.

For example, in some traditional bulk acoustic wave resonators, the conductive connector and the cover structure are disposed on the same side of the piezoelectric layer, and the conductive connector is electrically connected to the conductive pad through a via hole located in the cover bonding layer and the cover substrate, and further electrically connected to the corresponding electrode through the conductive pad. In these bulk acoustic wave resonators, a portion of the conductive connector is embedded in the cover bonding layer, thus if the cover bonding layer undergoes a deformation such as expansion or contraction, and if problems such as delamination are occurred between the cover bonding layer and the conductive pad, it will further adversely affect the conductive connector embedded in the cover bonding layer, for example, it may result in problems such as frequency deviation and fracture of the conductive connector, which may affect the electrical connection between the conductive connector and the conductive pad, thereby reducing the reliability of the device. Compared with the traditional bulk acoustic wave resonators, in the bulk acoustic wave resonator provided by the embodiments of the present disclosure, the conductive connectors and the cover structure are disposed on different sides of the piezoelectric layer, so that the conductive connectors are not in direct contact with the cover bonding layer. Therefore, even if issues such as deformation and delamination are occurred to the cover bonding layer, the conductive connectors will substantially not be adversely affected, and effective electrical connection between the conductive connectors and the corresponding electrodes can be ensured, and the reliability of the device is improved.

FIG. 1 illustrates a schematic cross-sectional view of a bulk acoustic wave resonator according to some embodiments of the present disclosure.

Referring to FIG. 1, in some embodiments, a bulk acoustic wave resonator 500 includes a piezoelectric layer 100, a first electrode layer 110, a second electrode layer 210, one or more conductive pads 213, a carrier structure 10, a cover structure 20, a first conductive connector C1 and a second conductive connector C2. The piezoelectric layer 100 has a first side 100a and a second side 100b opposite to each other in a first direction D1. The first electrode layer 110 and the carrier structure 10 are disposed on the first side 100a of the piezoelectric layer 100; the second electrode layer 210, the one or more conductive pads 213 and the cover structure 20 are disposed on the second side 100b of the piezoelectric layer 100. The first conductive connector C1 and the second conductive connector C2 are located on the first side 100a of the piezoelectric layer 100 and away from the cover structure 20.

In some embodiments, the first electrode layer 110 includes a first electrode E1 and an additional electrode AE1, and the first electrode E1 and the additional electrode AE1 are electrically isolated from each other. For example, a portion of the carrier structure 10 may be located between the first electrode E1 and the additional electrode AE1 in a direction parallel to a main surface of the piezoelectric layer (for example, a horizontal direction including the second direction D2), and the first electrode E1 and the additional electrode AE1 are spaced apart and electrically isolated from each other by this portion of the carrier structure 10. The second electrode layer 210 may at least include a second electrode E2, and the second electrode E2 is electrically connected to the additional electrode AE1 located in the first electrode layer 110. In some embodiments, the first conductive connector C1 extends through the carrier structure 10 to be electrically connected to the first electrode E1. The second conductive connector C2 extends through the carrier structure 10 to be electrically connected to the additional electrode AE1.

In some embodiments, the carrier structure 10 is located on a side of the piezoelectric layer 100 and the first electrode layer 110 away from the second electrode layer 210, and covers a sidewall of the additional electrode AE1 and a surface of the additional electrode AE1 at a side away from the piezoelectric layer 110, and covers a portion of a surface of a first electrode structure including the first electrode E1 at a side away from the piezoelectric layer. A first cavity RC1 is disposed between the carrier structure 10 and the piezoelectric layer 100, and at least a portion of the first electrode E1 is located in the first cavity RC1; for example, the first electrode E1 is located in the first cavity RC1 and extends beyond an edge of the first cavity RC1; the first electrode E1 may have a sidewall exposed in the first cavity RC1.

In some embodiments, the cover structure 20 includes a cover bonding layer 216 and a cover substrate 220; the cover bonding layer 216 is disposed between the cover substrate 220 and the piezoelectric layer 100 in a first direction D1, and the cover bonding layer 216 is bonded to a portion of the surface of the piezoelectric layer 100 and portion(s) of surfaces of the one or more conductive pads 213. A second cavity RC2 is disposed between the cover structure 20 and the piezoelectric layer 100, and at least a portion of the second electrode layer 210 (for example, at least a portion of the second electrode E2) may be located in the second cavity RC2. For example, the second electrode layer 210 has a portion located in the second cavity RC2, and laterally extends beyond an edge of the second cavity in a direction parallel to the main surface of the piezoelectric layer. In some embodiments, the piezoelectric layer 100, the first electrode E1, the second electrode E2, the first cavity RC1 and the second cavity RC2 at least partially overlap each other in a direction perpendicular to the main surface of the piezoelectric layer 100. Herein, multiple components overlapping/being overlapped in a certain direction represents that orthographic projections of the multiple components on a reference plane perpendicular to the certain direction are overlapped with each other. In other words, orthographic projections of the piezoelectric layer 100, the first electrode E1, the second electrode E2, the first cavity RC1 and the second cavity RC2 on the main surface of the piezoelectric layer are at least partially overlapped with each other. The main surface of the piezoelectric layer refers to a surface thereof which is in contact with the first electrode or the second electrode.

In some embodiments, the one or more conductive pads are located on the second side of the piezoelectric layer 100, and may extend through the piezoelectric layer 100 so as to be electrically connected to the corresponding electrode(s) in the first electrode layer 110. For example, the one or more conductive pads may at least include an interconnection pad 213c; the interconnection pad 213c is electrically connected to the second electrode E2, and extends through the second electrode E2 and the piezoelectric layer 100 so as to be electrically connected to the additional electrode AE1. The one or more conductive pads include a metallic material, such as gold (Au). For example, the second electrode E2 may be provided with an electrode via hole, and the piezoelectric layer 100 may be provided with an additional piezoelectric via hole, and the electrode via hole and the additional piezoelectric via hole are in spatial communication with each other, so as to expose a portion of the surface of the additional electrode AE1 at a side close to the piezoelectric layer. The interconnection pad 213c is in contact with and electrically connected to the second electrode E2, and is electrically connected to the additional electrode AE1 through the electrode via hole in the second electrode E2 and the additional piezoelectric via hole in the piezoelectric layer 100, and further electrically connected to the second conductive connector C2 through the additional electrode AE1. That is to say, the second conductive connector C2 is electrically connected to the second electrode E2 through the additional electrode AE1 and the interconnection pad 213c.

In some embodiments, a passivation layer 212 is further disposed on a side of the second electrode layer 210 away from the piezoelectric layer 100, and the passivation layer 212 is provided with a passivation opening to expose a portion of the surface of the second electrode E2; the passivation opening may be in spatial communication with the electrode via hole in the second electrode E2 and with the additional piezoelectric via hole. The interconnection pad 213c may be disposed on a side of the second electrode E2 away from the piezoelectric layer, and pass through the passivation opening, the electrode via hole and the additional piezoelectric via hole so as to be electrically connected to the additional electrode AE1. A sidewall of a part of the second electrode E2 defining the electrode via hole and a surface of the part of the second electrode E2 at a side away from the piezoelectric layer 100 may be covered by and in contact with the interconnection pad 213c. In some examples, a portion of the interconnection pad 213c located on a side of the second electrode E2 away from the piezoelectric layer may be located in the passivation opening; and a surface of the interconnection pad 213c at a side away from the piezoelectric layer may be substantially level with a surface of the passivation layer 212 at a side away from the piezoelectric layer in a direction (e.g., the second direction D2) parallel to the main surface of the piezoelectric layer, but the present disclosure is not limited thereto. In some other examples, the interconnection pad 213c may further extend to cover a portion of the surface of the passivation layer 212 at the side away from the piezoelectric layer; that is to say, with respect to the same main surface of the piezoelectric layer, the surface of the interconnection pad 213c at the side away from the piezoelectric layer may be higher than the surface of the passivation layer 212 at the side away from the piezoelectric layer. Herein, the first direction D1 and the second direction D2 intersect with each other, such as are perpendicular to each other; for example, in the illustrated example, the first direction D1 is a vertical direction, and the second direction D2 is a horizontal direction.

In some embodiments, the one or more conductive pads may further include a first conductive pad 213a electrically connected to the first electrode E1 and a second conductive pad 213b electrically connected to the second electrode E2. The piezoelectric layer 100 may be further provided with a piezoelectric via hole which exposes a portion of the surface of the first electrode E1; the first conductive pad 213a is disposed on the second side of the piezoelectric layer, and may be electrically connected to the first electrode E1 through the piezoelectric via hole. The second conductive pad 213b may be disposed on a side of the second electrode E2 and the passivation layer 212 away from the piezoelectric layer, and may extend to pass through the passivation layer 212 so as to be electrically connected to the second electrode E2. The first conductive pad 213a and the second conductive pad 213b may be used as test pads, for example, to test the related performances of the resonator during the manufacturing process of the resonator.

In some embodiments, the cover bonding layer 216 may be in contact with part of the one or more conductive pads, and the part of conductive pads has an embedded portion EP covered by the cover bonding layer 216; a contact area between the embedded portion EP and the cover bonding layer 216 may be greater than or equal to an area of a surface of the embedded portion EP at a side away from the piezoelectric layer 100. For example, the cover bonding layer 216 may be in contact with a portion of the surface of the first conductive pad 213a and a portion of the surface of the interconnection pad 213c, and each of the first conductive pad 213a and the interconnection pad 213c has an embedded portion EP covered by the cover bonding layer 216. In some embodiments, the cover bonding layer 216 is not provided with any via hole for electrical connection between other conductive components and the conductive pads; that is, there is free of conductive component embedded in the cover bonding layer 216 and electrically connected to the conductive pad. That is to say, a conductive component electrically connected with the conductive pad may not be disposed on a side of the embedded portion EP of the conductive pad away from the piezoelectric layer 100, and at least a surface of the embedded portion EP of the conductive pad at a side away from the piezoelectric layer is completely covered by the cover bonding layer 216; a sidewall of the embedded portion EP of part of the conductive pads (for example, the first conductive pad 213a) may also be covered by the cover bonding layer, and a sidewall of the embedded portion EP of part of the conductive pads (for example, the interconnection pad 213c) may be covered by the passivation layer 212. Therefore, a contact area between the embedded portion EP of the first conductive pad 213a and the cover bonding layer 216 is substantially equal to a sum of a surface area of a sidewall of the embedded portion EP and an area of a surface of the embedded portion EP at a side away from the piezoelectric layer; a contact area between the embedded portion EP of the interconnection pad 213c and the cover bonding layer 216 may be substantially equal to an area of the surface of the embedded portion EP at the side away from the piezoelectric layer.

In the embodiment of the present disclosure, because the first conductive connector and the second conductive connector are disposed on a side of the piezoelectric layer away from the cover structure, instead of being disposed at a side where the cover structure is located, a conductive component electrically connected with the embedded portion of the conductive pad may not be disposed in the cover bonding layer. In this way, on the one hand, the stability of the conductive connector can be improved, and the effective electrical connection between the conductive connector and conductive component such as the electrode can be ensured, thereby improving the reliability of the device; and on the other hand, the contact area between the cover bonding layer and the conductive pad bonded thereto can be increased, thereby avoiding or reducing the possibility of delamination between the cover bonding layer and the conductive pad caused by a deformation of the cover bonding layer, and further improving the reliability of the device to a certain extent.

In some embodiments, the bulk acoustic wave resonator 500 may further include an edge protruding layer 111, which is disposed on a side of the first electrode E1 away from the piezoelectric layer 100, and may cover a surface of an edge region of a portion of the first electrode E1 located in the first cavity RC1 at a side away from the piezoelectric layer and a surface of a portion of the first electrode E1 located outside the first cavity RC1 at the side away from the piezoelectric layer. A surface of a central region of the portion of the first electrode E1 located in the first cavity RC1 at the side away from the piezoelectric layer is not covered by the edge protruding layer 111. The edge protruding layer 111 includes a conductive material, and is electrically connected to the first electrode E1. In some embodiments, the first electrode E1 and the edge protruding layer 111 together constitute the first electrode structure ES1; and in some other examples, the edge protruding layer 111 may also be omitted, that is, the first electrode structure ES1 may only include the first electrode E1. In some embodiments, a passivation layer 112 is further provided on a side of the first electrode E1 and the edge protruding layer 111 away from the piezoelectric layer 100. The passivation layer 112 may cover a sidewall of the edge protruding layer 111 and a surface of the edge protruding layer 111 at a side away from the piezoelectric layer, and cover a portion of the surface of the first electrode E1 at a side away from the piezoelectric layer. In some embodiments, the edge protruding layer 111 and the passivation layer 112 are only disposed on the first electrode E1 of the first electrode layer 110, and are not disposed on the additional electrode AE1. That is, the additional electrode AE1 is spaced apart from the edge protruding layer 111 and the passivation layer 112.

In some embodiments, the first conductive connector C1 extends to pass through the carrier structure 10 and the passivation layer 112 and is electrically connected to the edge protruding layer 111, and further electrically connected to the first electrode E1 through the edge protruding layer 111. The second conductive connector C2 extends to pass through the carrier structure 10, and is directly and electrically connected to the additional electrode AE1. In some embodiments, the first conductive connector C1 includes a first conductive via V1 and a first conductive bump 125a connected with each other; the second conductive connector C2 includes a second conductive via V2 and a second conductive bump 125b connected with each other. At least a portion of the first conductive via V1 and at least a portion of the second conductive via V2 are embedded in the carrier structure 10, and the first conductive bump 125a is electrically connected to the first electrode E1 through the first conductive via V1, and the second conductive bump 125b is electrically connected to the additional electrode AE1 through the second conductive via V2.

In some embodiments, each conductive via of the first conductive via V1 and the second conductive via V2 includes a seed layer 121 and a conductive layer 122, and the conductive layer 122 is located on a side of the seed layer 121 away from the carrier structure 10 and the first electrode layer 110. For example, in the first conductive via V1, the seed layer 121 is located between the conductive layer 122 and the carrier structure 10, and between the conductive layer 122 and the first electrode structure; in the second conductive via V2, the seed layer 121 is located between the conductive layer 122 and the carrier structure 10, and between the conductive layer 122 and the additional electrode AE1.

Still referring to FIG. 1, in some embodiments, a portion of the carrier structure 10 is located between the first electrode E1 and the additional electrode AE1 in a direction (e.g., a horizontal direction including the second direction D2) parallel with the main surface of the piezoelectric layer, and the additional electrode AE1 is located on a side of this portion of the carrier structure 10 away from the first cavity RC1 in this direction; and the additional electrode AE1 is spaced apart from the first cavity RC1 by this portion of the carrier structure 10. This portion of the carrier structure 10 may be referred to as a spacer portion. In some embodiments, a portion of the first cavity RC1 may be located between the spacer portion of the carrier structure 10 and the first electrode E1 in a direction parallel to the main surface of the piezoelectric layer. That is to say, a portion of the carrier structure 10 and a portion of the first cavity RC1 may be located between the first electrode E1 and the additional electrode AE1.

In some embodiments, the additional electrode AE1 is spaced apart from the first cavity RC1 by the carrier structure 10, which represents that the additional electrode AE1 is not located in the first cavity RC1 and has no surface exposed to the first cavity RC1.

In some embodiments, the carrier structure 10 may include a supporting dielectric layer 113a, a cavity boundary layer 115, a carrier bonding layer 116 and a carrier substrate 120. For example, the supporting dielectric layer 113a is disposed on a side of the first electrode layer 110 and the first electrode structure ES1 away from the piezoelectric layer 100, and a portion of the supporting dielectric layer 113a is located between the first electrode E1 and the additional electrode AE1 in the direction (e.g., the second direction D2) parallel to the main surface of the piezoelectric layer. The carrier bonding layer 116 is located on a side of the supporting dielectric layer 113a away from the piezoelectric layer 100. The cavity boundary layer 115 is located between the supporting dielectric layer 113a and the carrier bonding layer 116, and is located on sides of the supporting dielectric layer 113a and the carrier bonding layer 116 close to the first cavity RC1; the cavity boundary layer 115 defines a portion of a boundary of the first cavity RC1. The carrier substrate 120 is located on a side of the carrier bonding layer 116 away from the piezoelectric layer 100.

For example, the supporting dielectric layer 113a may cover a sidewall of the additional electrode AE1 and a surface of the additional electrode AE1 at a side away from the piezoelectric layer, and may cover a surface of the passivation layer 112 at a side away from the piezoelectric layer. The supporting dielectric layer 113a is located at an outer side of the cavity boundary layer 115 away from the first cavity RC1 in the direction parallel to the main surface of the piezoelectric layer. For example, the supporting dielectric layer 113a may include a first dielectric part 113a1 and a second dielectric part 113a2. The first dielectric part 113a1 covers a portion of the surface of the passivation layer 112 at a side away from the piezoelectric layer, and an orthographic projection of the first dielectric part 113a1 on the main surface of the piezoelectric layer 100 overlaps with an orthographic projection of the first electrode E1 on the main surface of the piezoelectric layer. The second dielectric part 113a2 is located on a side of the additional electrode AE1 away from the piezoelectric layer, covers and contacts a surface of the additional electrode AE1 at a side away from the piezoelectric layer; and the second dielectric part 113a2 may further extend to be between the additional electrode AE1 and the cavity boundary layer 115, so as to cover and contact a sidewall of the additional electrode AE1 and a portion of a surface of the piezoelectric layer 100 at a side away from the second electrode layer. In some embodiments, an orthographic projection of the additional electrode AE1 on the main surface of the piezoelectric layer may be located within a range of an orthographic projection of the second dielectric part 113a2 on the main surface of the piezoelectric layer. In some embodiments, because the first electrode E1 is provided with the edge protruding layer 111 and/or the passivation layer 112 thereon, while the additional electrode AE1 is not provided with the edge protruding layer 111 and/or the passivation layer 112 thereon, a thickness of the second dielectric part 113a2 overlapped with the additional electrode AE1 in the first direction D1 may be greater than a thickness of the first dielectric part 113a1 overlapped with the first electrode E1 in the first direction D1. Herein, the thickness of the dielectric part refers to a thickness thereof in the first direction D1 perpendicular to the main surface of the piezoelectric layer. A portion of the passivation layer 112 is located between the first electrode (or the first electrode structure including the first electrode) and the first dielectric part 113a1, and separates the first electrode E1 from the first dielectric part 113a1. Since there is no passivation layer disposed on the side of the additional electrode AE1 away from the piezoelectric layer, the additional electrode AE1 can be in direct contact with the second dielectric part 113a2.

In some embodiments, the carrier structure 10 is provided with a first connection via hole and a second connection via hole, and the first conductive connector C1 is electrically connected to the first electrode E1 through the first connection via hole, and the second conductive connector C2 is electrically connected to the additional electrode AE1 through the second connection via hole. For example, the passivation layer 112 is provided with a passivation opening in spatial communication with the first connection via hole, so that the first connection via hole and the passivation opening expose a portion of the surface of the first electrode structure ES1, and hence the first conductive connector C1 can pass through the first connection via hole and the passivation opening to be electrically connected to the first electrode structure. For example, the second connection via hole may expose a portion of the surface of the additional electrode AE1, and the second conductive connector C2 may pass through the second connection via hole to be electrically connected to the additional electrode AE1.

In some embodiments, the first connection via hole and the second connection via hole may be at least located in the supporting dielectric layer 113a, the carrier bonding layer 116 and the carrier substrate 120. For example, a portion of the supporting dielectric layer 113a is spaced apart from a portion of the carrier bonding layer 116 by the cavity boundary layer 115; and the supporting dielectric layer 113a and the carrier bonding layer 116 have portions which are in contact with each other. For example, the first connection via hole and the second connection via hole are disposed in the carrier substrate and in the portions of the supporting dielectric layer 113a and the carrier bonding layer 116 that are in contact with each other. In this example, the first connection via hole and the second connection via hole are spaced apart from the cavity boundary layer 115. For example, an orthographic projection of the first conductive connector C1 and an orthographic projection of the second conductive component C2 on the main surface of the piezoelectric layer may be offset from an orthographic projection of the cavity boundary layer 115 on the main surface of the piezoelectric layer. However, the present disclosure is not limited thereto. In an alternative embodiment, the supporting dielectric layer 113a may be completely spaced apart from the carrier bonding layer 116 by the cavity boundary layer 115; and the first connection via hole and the second connection via hole may be located in the supporting dielectric layer 113a, the cavity boundary layer 115, the carrier bonding layer 116 and the carrier substrate 120.

Still referring to FIG. 1, in some embodiments, the carrier bonding layer 116 includes a bonding body P1 and a bonding protrusion P2. The bonding body P1 is located on a side of the supporting dielectric layer 113a away from the piezoelectric layer 100 in the first direction D1 perpendicular to the main surface of the piezoelectric layer, and may extend in a direction parallel to the main surface of the piezoelectric layer. The bonding protrusion P2 is located on a side of the bonding body P1 close to the piezoelectric layer 100 and is protruded, in the first direction D1, from a surface of the bonding body P1 at a side close to the piezoelectric layer 100 towards the piezoelectric layer 100. In some embodiments, the first cavity RC1 is located between the piezoelectric layer 100 and the bonding body P1 in the first direction D1, and is surrounded by the bonding protrusion P2 in the direction parallel to the main surface of the piezoelectric layer (e.g., a horizontal direction including the second direction D2).

For example, the bonding body P1 may include a first body part P1a and a second body part P1b. An orthographic projection of the first body part P1a on the piezoelectric layer 100 is overlapped with an orthographic projection of the first cavity RC1 on the piezoelectric layer 100, and is overlapped with an orthographic projection of the bonding protrusion P2 on the piezoelectric layer 100. The orthographic projection of the first cavity RC1 on the piezoelectric layer 100 may be located within a range of the orthographic projection of the first body part P1a on the piezoelectric layer 100. A portion of the first body part P1a is located between inner sidewalls of the bonding protrusion P2 at a side close to the first cavity RC1 in the direction parallel to the main surface of the piezoelectric layer. The second body part P1b is located on a side of the bonding protrusion P2 away from the first cavity RC1 in the direction parallel to the main surface of the piezoelectric layer, and is located on a side of the first body part P1a close to an edge of the resonator; the second body part P1b may surround the first body part P1a.

Still referring to FIG. 1, in some embodiments, the cavity boundary layer 115 may at least cover surfaces of the bonding protrusion P2 and the first body part P1a of the bonding body at a side close to piezoelectric layer, and the bonding protrusion P2 is spaced apart from the supporting dielectric layer 113a by the cavity boundary layer 115. For example, the cavity boundary layer 115 may extend along sidewalls of the bonding protrusion P2 and a surface of the bonding protrusion P2 at a side close to piezoelectric layer, as well as a surface of the first body part P1a of the bonding body P1 at a side close to piezoelectric layer. A first part of the cavity boundary layer 115 covers a sidewall IS of the bonding protrusion P2 at a side close to first cavity RC1, and a surface of the first body part P1a between the bonding protrusion P2 at a side close to piezoelectric layer; and the first part of the cavity boundary layer 115 and a portion of the surface of the piezoelectric layer 100 together define the first cavity RC1. A second part of the cavity boundary layer 115 is located on a side of the bonding protrusion P2 away from the carrier substrate 120, and is located between the bonding protrusion P2 and the piezoelectric layer 100 and/or between the bonding protrusion P2 and the passivation layer 112. A third part of the cavity boundary layer 115 is located between a sidewall OS of the bonding protrusion P2 at a side away from the first cavity RC1 and a sidewall of the supporting dielectric layer 113a, so that the supporting dielectric layer 113a is spaced apart from the bonding protrusion P2 by the cavity boundary layer 115 in the direction parallel to the main surface of the piezoelectric layer. In some embodiments, the cavity boundary layer 115 may further include a portion located between at least a portion of the bonding body P1 and the supporting dielectric layer 113a in the first direction D1, so that the at least portion of the bonding body P1 is spaced apart from the supporting dielectric layer 113a by the cavity boundary layer 115 in the first direction D1.

In some embodiments, the supporting dielectric layer 113a may be in direct contact with at least a portion of the second body part P1b of the bonding body P1, that is, the cavity boundary layer 115 may not be disposed between the supporting dielectric layer 113a and the at least portion of the second body part P1b.

In other words, the supporting dielectric layer 113a is located on a side of the bonding body P1 of the bonding layer 116 close to piezoelectric layer in the first direction D1 perpendicular to the main surface of the piezoelectric layer, and is located on a side of the bonding protrusion P2 and a portion of the cavity boundary layer 115 covering the bonding protrusion away from the first cavity RC1 in the direction parallel to the main surface of the piezoelectric layer. In some embodiments, the bonding protrusion P2 and the portion of the cavity boundary layer 115 covering the bonding protrusion P2 surround the first cavity RC1 in the direction parallel to the main surface of the piezoelectric layer, and may be surrounded by the supporting dielectric layer 113a.

Still referring to FIG. 1, in some embodiments, the second cavity RC2 may be surrounded and delimited by the cover bonding layer 216, the cover substrate 220, the piezoelectric layer 100 and/or part of components located on the piezoelectric layer 100; and part of components on the second side 100b of the piezoelectric layer 100 are located in the second cavity RC2. For example, a portion of the second electrode layer 210, a portion of the passivation layer 212, and part or all of one or more conductive pads among the plurality of conductive pads may be located in the second cavity RC2. In some embodiments, the cover bonding layer 216 may be in an ring shape, and have a sidewall delimiting the second cavity RC2; that is, the cover bonding layer 216 surrounds the second cavity RC2 in a direction parallel to the main surface of the piezoelectric layer. The cover bonding layer 216 may be bonded to a portion of the surface of the piezoelectric layer 100 at a side away from the first electrode layer 110 (for example, a portion of the surface of an edge of the piezoelectric layer 100), a portion of the surface of one or more conductive pads (for example, the first conductive pad 213a and the interconnection pad 213c) among the plurality of conductive pads, and a portion of the surface of an edge portion of the passivation layer 212 at a side away from the piezoelectric layer.

In some embodiments, a material of the cover bonding layer 216 and a material of the carrier bonding layer 116 may be different from each other. For example, the cover bonding layer 216 may include an organic material, and the carrier bonding layer 116 may include an inorganic material. For example, the cover bonding layer 216 may include a dry film, and the carrier bonding layer 116 may include silicon oxide or the like.

The embodiment of the present disclosure provides a method for manufacturing a bulk acoustic wave resonator, including: sequentially forming a second electrode layer, a piezoelectric layer and a first electrode layer, wherein the first electrode layer and the second electrode layer are respectively located on a first side and a second side of the piezoelectric layer opposite to each other in a first direction; performing a patterning process on the first electrode layer to form a first electrode and an additional electrode, and form a gap between the first electrode and the additional electrode, so that the first electrode and the additional electrode are spaced apart from each other and electrically isolated from each other; forming a carrier structure on a side of the piezoelectric layer and the first electrode layer away from the second electrode layer, wherein a portion of the carrier structure is filled in the gap; and forming a first cavity between the piezoelectric layer and the carrier structure, wherein a portion of the first electrode is located in the first cavity; performing a patterning process on the second electrode layer to form a second electrode; forming one or more conductive pads on the second side of the piezoelectric layer, wherein the one or more conductive pads at least include an interconnection pad, and the interconnection pad is electrically connected to the second electrode and extends to pass through the second electrode and the piezoelectric layer so as to be electrically connected to the additional electrode; bonding the cover structure to the second side of the piezoelectric layer and forming a second cavity between the cover structure and the piezoelectric layer, wherein the cover structure includes a cover bonding layer and a cover substrate, the cover bonding layer is disposed between the cover substrate and the piezoelectric layer in the first direction, and a portion of the second electrode layer is located in the second cavity; forming a first connection via hole and a second connection via hole extending through the carrier structure; and forming a first conductive connector and a second conductive connector on a side of the piezoelectric layer away from the cover structure, wherein the first conductive connector is electrically connected to the first electrode through the first connection via hole, the second conductive connector is electrically connected to the additional electrode through the second connection via hole, and further electrically connected to the second electrode through the additional electrode and the interconnection pad.

FIG. 2 to FIG. 23 are schematic cross-sectional views illustrating structures of various steps in the manufacturing method for a bulk acoustic wave resonator according to some embodiments of the present disclosure. In some embodiments, the manufacturing method adopts a wafer level packaging (WLP) process.

Figure 2:
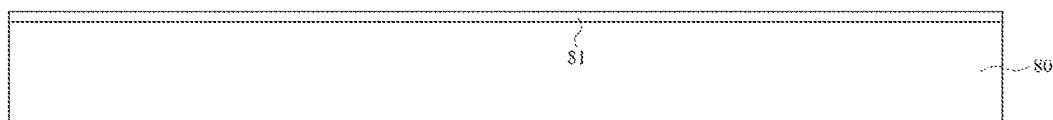
FIG. 2 to FIG. 23 are schematic cross-sectional views illustrating structures in various steps of a method for manufacturing a bulk acoustic wave resonator according to some embodiments of the present disclosure.

Referring to FIG. 2, a substrate 80 is provided. The substrate 80 may be a semiconductor substrate, such as a silicon substrate, but the present disclosure is not limited thereto. The substrate 80 may also adopt other suitable materials, such as glass substrate, as long as it can provide a structural support for the subsequently formed overlying layer(s). The substrate 80 will be removed in a subsequent process, and may also be referred to as a sacrificial substrate. In some embodiments, the substrate 80 is a wafer-level substrate.

In some embodiments, a dielectric layer 81 is formed on the substrate 80. The dielectric layer 81 may be an oxide layer, including silicon oxide ($SiO_2$), for example. The dielectric layer 81 may be formed by a deposition process such as chemical vapor deposition or a thermal oxidation process.

Figure 3:
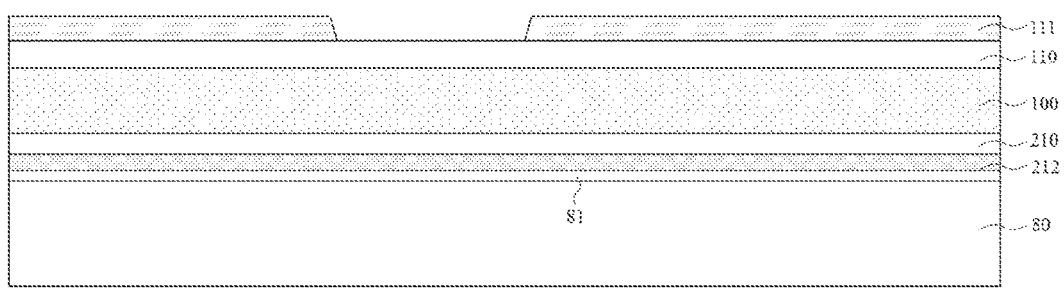

Referring to FIG. 2 and FIG. 3, a passivation layer 212, a second electrode layer 210, a piezoelectric layer 100 and a first electrode layer 110 are sequentially formed on the dielectric layer 101. The passivation layer 212 may include an insulating material such as aluminum nitride, silicon nitride, the like or combinations thereof. For example, a layer of the above-mentioned material may be formed by a suitable deposition process such as a chemical vapor deposition process and a physical vapor deposition process. The first electrode layer 110 and the second electrode layer 210 may each include a suitable electrode material, for example, include a metallic material, such as molybdenum (Mo), aluminum (Al), copper (Cu), platinum (Pt), tantalum (Ta), tungsten (W), palladium (Pd), ruthenium (Ru), the like, alloys thereof or combinations thereof. The piezoelectric layer 100 may include a suitable piezoelectric material, such as aluminum nitride (AlN), scandium-doped aluminum nitride (ScAlN), zinc oxide, lithium niobate, lithium tantalate and other materials with piezoelectric properties. It should be understood that the above materials are only for illustration, and the present disclosure is not limited thereto.

Referring to FIG. 3, in some embodiments, an edge protruding layer is formed on a side of the first electrode layer 110 away from the substrate 80, and a patterning process including an etching process is performed on the edge protruding layer to remove a portion of the edge protruding layer, so as to form an edge protruding layer 111 having an opening. The opening exposes a portion of the surface of the first electrode layer 110 at a side away from the substrate 80.

Figure 4:
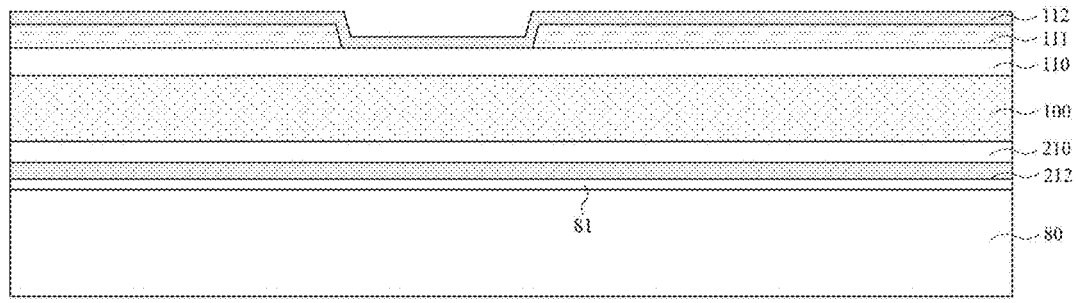

Referring to FIG. 4, a passivation layer 112 is formed on a side of the first electrode layer 110 and the edge protruding layer 111 away from the piezoelectric layer 100. The passivation layer 112 covers a surface of the edge protruding layer 111 at a side away from the piezoelectric layer, fills into the opening of the edge protruding layer 111, and covers a sidewall of the edge protruding layer 111 and the surface of the first electrode layer 110 exposed by the opening. The passivation layer 112 may include an insulating material such as aluminum nitride, silicon nitride, the like or combinations thereof, and the material of the passivation layer 112 may be as same as or different from that of the passivation layer 212.

Figure 5:
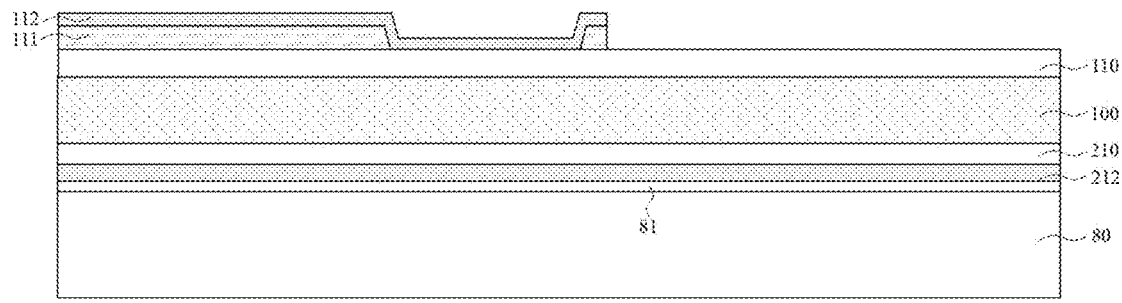
Figure 6:
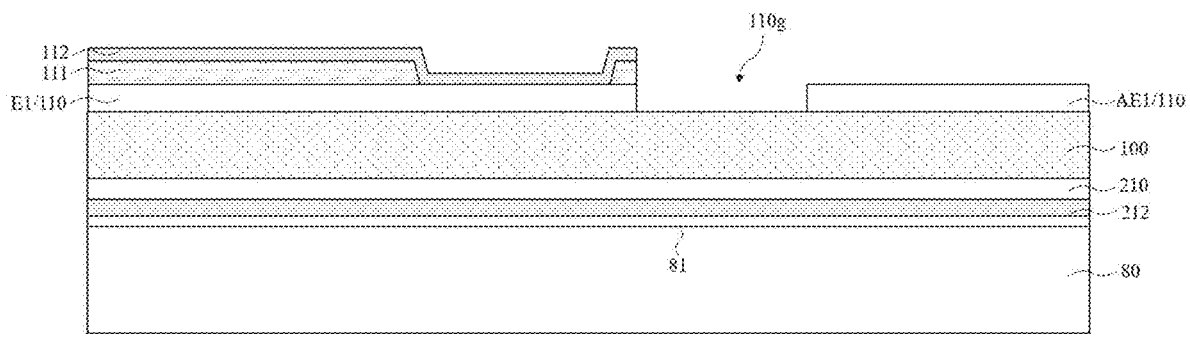

Referring to FIG. 4 to FIG. 6, a patterning process is performed on the passivation layer 112, the edge protruding layer 111 and the first electrode layer 110, so as to form a first electrode E1 and an additional electrode AE1 electrically isolated from each other, and to form the edge protruding layer 111 and the passivation layer 112 which cover the first electrode E1.

For example, referring to FIG. 4 and FIG. 5, a first patterning process is performed on the passivation layer 112 and the edge protruding layer 111. The first patterning process may include removing a portion of the passivation layer 112 and a portion of the edge protruding layer 111 through an etching process, thereby exposing a portion of the surface of the first electrode layer 110 at a side away from the piezoelectric layer 100. After the first patterning process, the remaining passivation layer 112 and the remaining edge protruding layer 111 may be located at a position corresponding to a position where the first electrode is to be formed later.

Referring to FIG. 5 and FIG. 6, a second patterning process is then performed on the first electrode layer 110. The second patterning process may include removing a portion of the first electrode layer 110 through an etching process, so as to form a first electrode E1 and an additional electrode AE1, and form a gap 110g between the first electrode E1 and the additional electrode AE1. The first electrode E1 is covered by the edge protruding layer 111 and the passivation layer 112; a sidewall of the first electrode E1 may be substantially aligned with a sidewall of the edge protruding layer 111 and/or a sidewall of the passivation layer 112 in a direction perpendicular to the main surface of the piezoelectric layer. The additional electrode AE1 is spaced apart from the first electrode E1 by the gap 110g, and is exposed, without being covered by the edge protruding layer 111 and the passivation layer 112.

Figure 7:
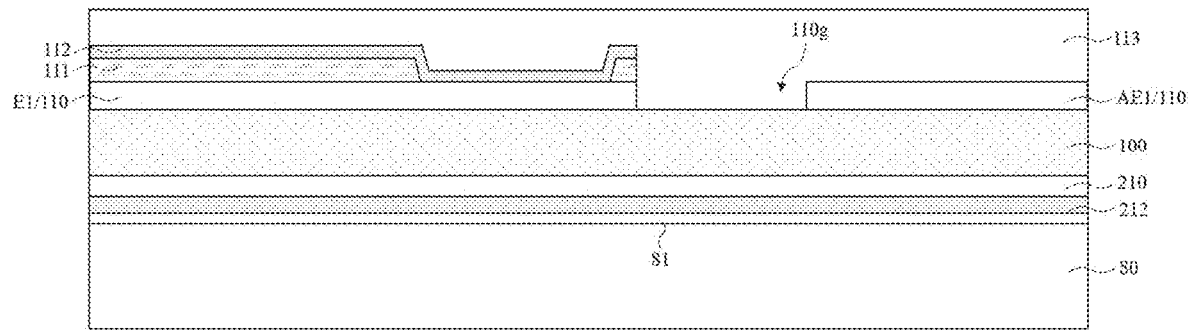

Referring to FIG. 6 and FIG. 7, a dielectric layer 113 is formed on a side of the first electrode layer 110 and the piezoelectric layer 100 away from the second electrode layer 210. The dielectric layer 113 covers surfaces of the first electrode layer 100 and the passivation layer 112 at a side away from the piezoelectric layer 100, and fills into the gap 110g of the first electrode layer 110 to cover sidewalls of the first electrode E1 and the additional electrode AE1 and sidewalls of the edge protruding layer 111 and the passivation layer 112, and a portion of the surface of the piezoelectric layer 100 at the side away from the second electrode layer 210. The dielectric layer 113 may include, for example, a suitable dielectric material such as silicon oxide, and may be formed by a deposition process such as CVD, a spin-coating method, or the like. In some embodiments, the dielectric layer 113 has a substantially flat surface. For example, a planarization process (e.g., a chemical mechanical polishing (CMP) process) may be performed on the dielectric material after the dielectric material is deposited, so that the dielectric layer 113 has a substantially flat surface.

Figure 8:
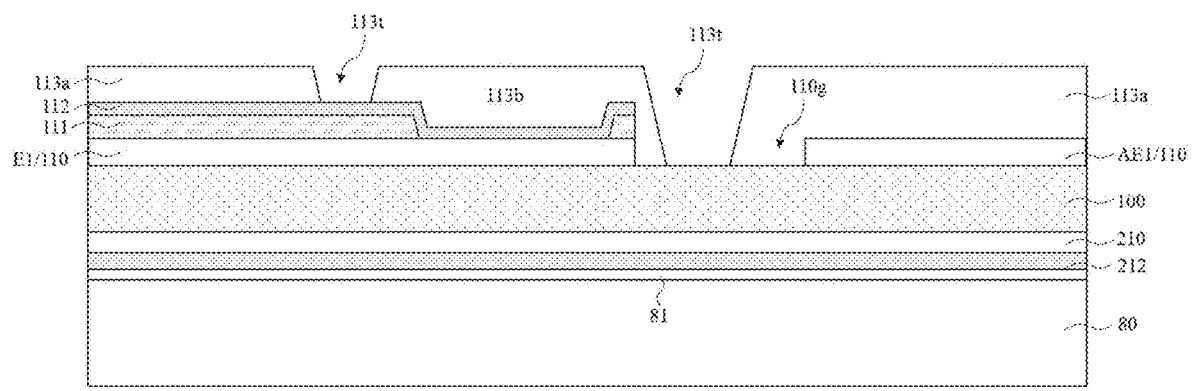

Referring to FIG. 7 and FIG. 8, a patterning process (for example, including a photolithography process and an etching process) is performed on the dielectric layer 113 to remove a portion of the dielectric layer 113 and form a trench 113t in the dielectric layer 113. In some embodiments, a portion of the dielectric layer 113 covering the passivation layer 112 and a portion of the dielectric layer 113 covering the piezoelectric layer 100 are removed; the portion of the dielectric layer 113 covering the passivation layer 112 may be overlapped with the edge protruding layer 111 and the first electrode E1 in the direction perpendicular to the main surface of the piezoelectric layer; the portion of the dielectric layer 113 covering the piezoelectric layer 100 includes a portion of the dielectric layer 113 located in the gap 100g between the first electrode E1 and the additional electrode AE1. In this way, a portion of the trench 113t exposes a portion of the surface of the passivation layer 112, and another portion of the trench 113t may expose a portion of the surface of the piezoelectric layer 100. For example, a portion of the trench 113t may be located in the gap 110g between the first electrode E1 and the additional electrode AE1, and expose a portion of the surface of the piezoelectric layer 100 at a side away from the second electrode layer.

In some embodiments, the trench 113t may be ring-shaped when viewed in a plan view. Herein, "ring-shaped" may include being in any type of ring shape, such as a circular ring shape, a square ring shape, a polygonal ring shape or an irregular ring shape. The trench 113t may have a closed ring-shaped structure, and divides the dielectric layer 113 into a supporting dielectric layer 113a and a sacrificial dielectric layer 113b that are spaced apart from each other. In other words, the sacrificial dielectric layer 113b is surrounded by the trench 113t and the supporting dielectric layer 113a in the direction parallel to the main surface of the piezoelectric layer, and is spaced apart from the supporting dielectric layer 113a by the trench 113t.

In some embodiments, the sacrificial dielectric layer 113b covers a portion of the surface of the passivation layer 112 at a side away from the piezoelectric layer, and covers sidewalls of the passivation layer 112, the edge protruding layer 111 and the first electrode E1. Orthographic projections of the opening of the edge protruding layer 111, a portion of the edge protruding layer 111 defining the opening, and portions of the first electrode and the passivation layer corresponding to the portion of the edge protruding layer 111 on the piezoelectric layer may be located within a range of an orthographic projection of the sacrificial dielectric layer 113b on the piezoelectric layer.

Figure 9:
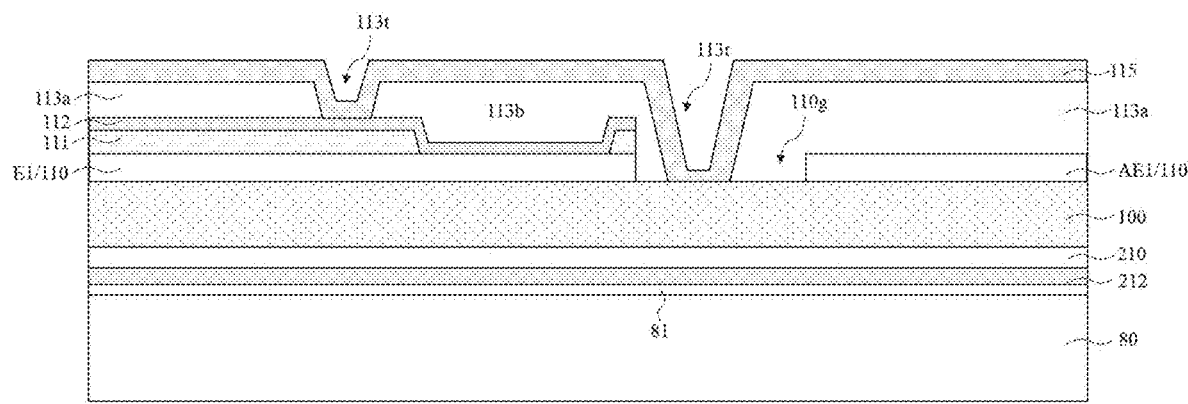

Referring to FIG. 9, a cavity boundary layer 115 is formed on a side of the dielectric layer 113 away from the piezoelectric layer and in the trench 113t of the dielectric layer 113. A material of the cavity boundary layer 115 is different from a material of the dielectric layer 113. In some embodiments, the material of the cavity boundary layer 115 may include a semiconductor material, a dielectric material, the like or a combination thereof. For example, the cavity boundary layer 115 may include amorphous silicon, polysilicon, silicon nitride, aluminum nitride, the like or combinations thereof, and may be formed by a suitable deposition process such as CVD and atomic layer deposition (ALD).

In some embodiments, the cavity boundary layer 115 continuously extends along a surface of the dielectric layer 113 at a side away from the piezoelectric layer and a surface of the trench 113t. For example, the cavity boundary layer 115 covers the surface of the trench 113t, and may at least partially fill the trench 113t. Specifically, the cavity boundary layer 115 covers a sidewall of the supporting dielectric layer 113a and a surface of the supporting dielectric layer 113a at a side away from the piezoelectric layer, a sidewall of the sacrificial dielectric layer 113b and a surface of the sacrificial dielectric layer 113b at a side away from the piezoelectric layer, a portion of the surface of the passivation layer 112 at a side away from the piezoelectric layer, and a portion of the surface of the piezoelectric layer 100 at a side away from the second electrode layer 210. The sacrificial dielectric layer 113b is located in a space enclosed by the cavity boundary layer 115, the piezoelectric layer 100 and the passivation layer 112.

Figure 10:
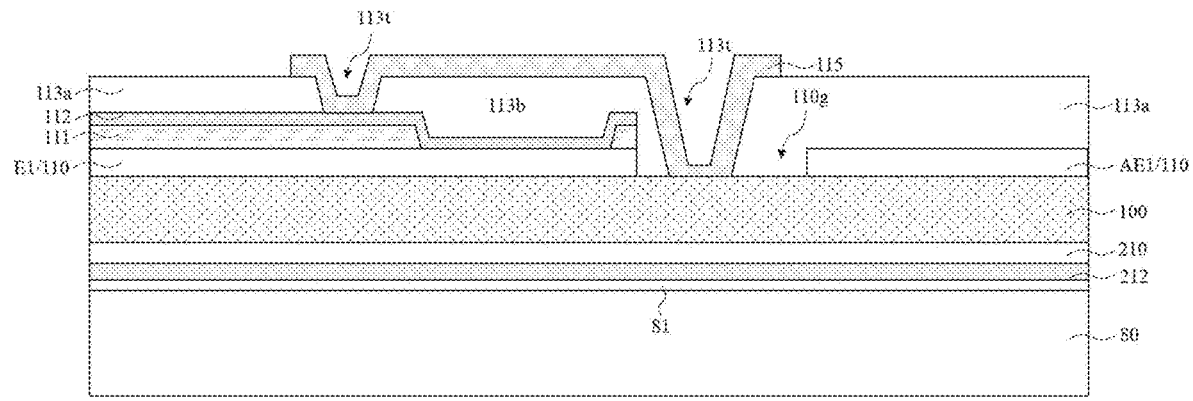

Referring to FIG. 9 and FIG. 10, in some embodiments, a portion of the cavity boundary layer 115 located on at least a portion of the surface of the supporting dielectric layer 113a at a side away from the piezoelectric layer may be removed by an etching process, so as to expose at least the portion of the surface of the supporting dielectric layer 113a at a side away from the piezoelectric layer. In some embodiments, after the etching process, the cavity boundary layer 115 covers at least a sidewall of the sacrificial dielectric layer 113b and a surface of the sacrificial dielectric layer 113b at a side away from the piezoelectric layer, or covers at least surfaces of the sacrificial dielectric layer 113b and the trench 113t.

Figure 11:
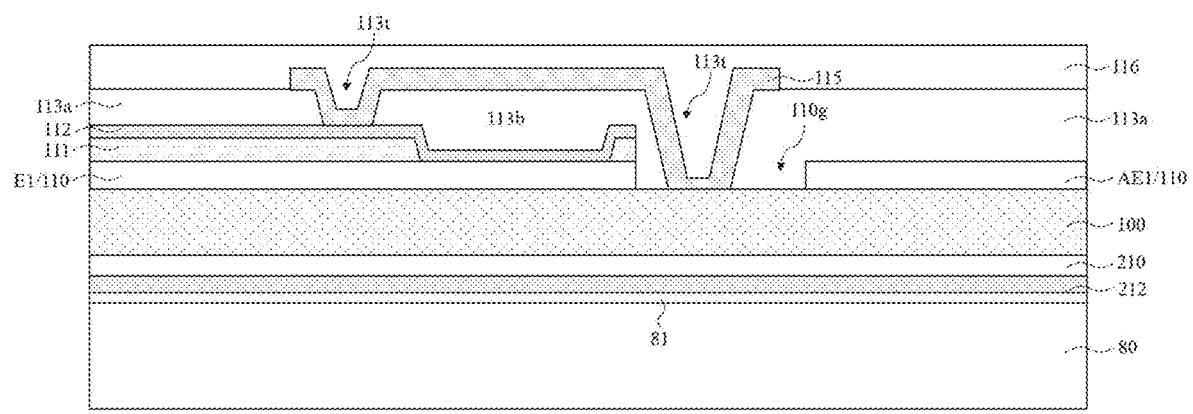

Referring to FIG. 11, a carrier bonding layer 116 is formed on a side of the dielectric layer 113 and the cavity boundary layer 115 away from the piezoelectric layer 100; the carrier bonding layer 116 covers a surface of the supporting dielectric layer 113a at a side away from the piezoelectric layer 100, as well as a sidewall of the cavity boundary layer 115 and a surface of the cavity boundary layer 115 at a side away from the piezoelectric layer. In some embodiments, the carrier bonding layer 116 substantially fills up the trench 113t, and the carrier bonding layer 116 may have a substantially flat surface at a side away from the piezoelectric layer to facilitate a subsequent bonding process. A material of the carrier bonding layer 116 may be different from that of the cavity boundary layer 115. For example, the carrier bonding layer 116 may include a dielectric material such as silicon oxide ($SiO_2$). The method of forming the carrier bonding layer 116 may include: depositing a bonding material layer and then performing a planarization process (for example, CMP) on the bonding material layer, so that the carrier bonding layer 116 has a flat surface.

Figure 12:
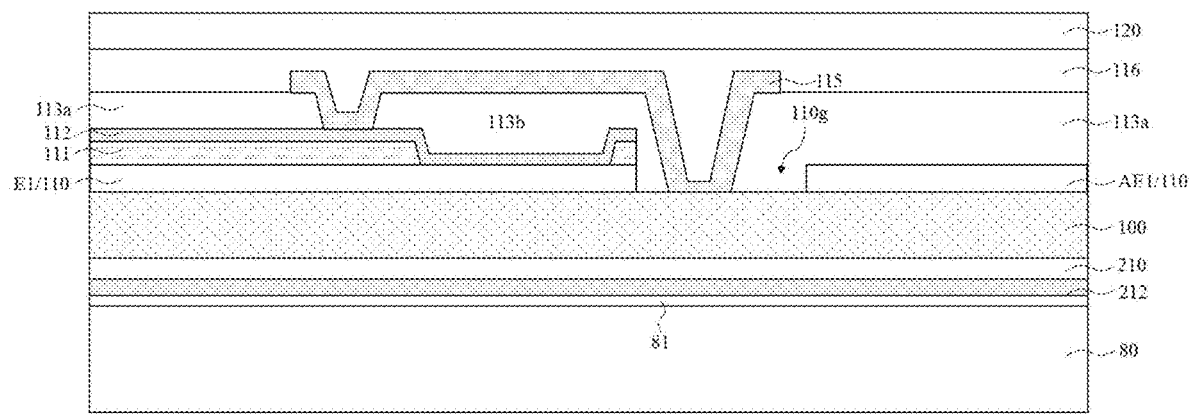

Referring to FIG. 12, a carrier substrate 120 is provided, and a bonding process is performed to bond the carrier substrate 120 and the carrier bonding layer 116 to each other. In some embodiments, the carrier substrate 120 may include a semiconductor material, a dielectric material, the like or a combination thereof. For example, the carrier substrate 120 may include silicon (Si), silicon oxide ($SiO_2$), polysilicon, silicon carbide, the like or a stacked layer including combinations thereof. In some embodiments, the carrier substrate 120 includes a semiconductor substrate (e.g., a silicon-containing substrate) and a dielectric material layer (e.g., silicon oxide) located on the semiconductor substrate, and may be bonded to the carrier bonding layer 116 through the dielectric material layer. In some embodiments, the carrier substrate 120 may be a semiconductor wafer, such as a silicon wafer.

Figure 13:
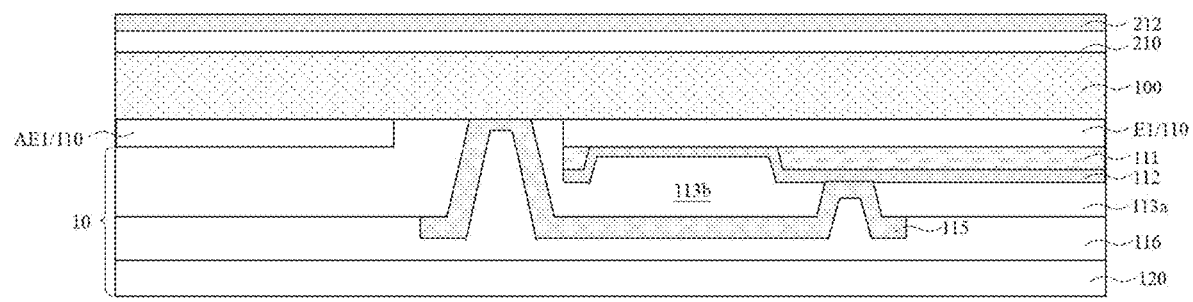
Figure 14:
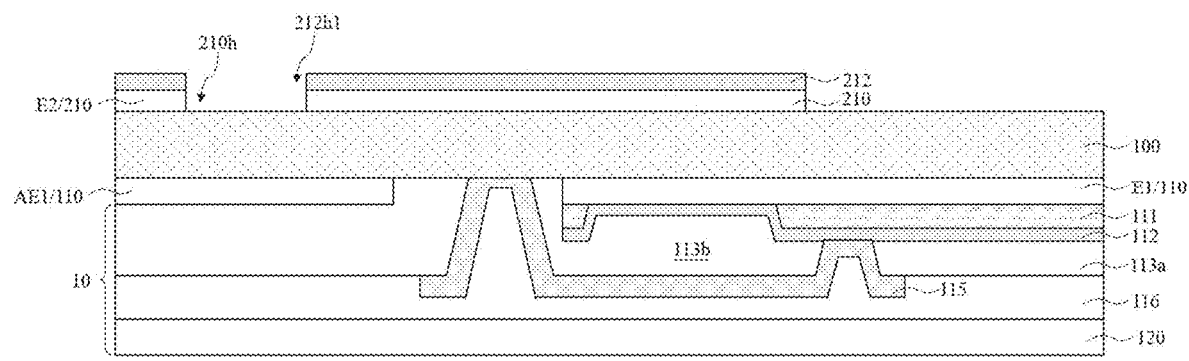

Referring to FIG. 12 and FIG. 13, the structure shown in FIG. 12 is turned over, and the substrate 80 and the dielectric layer 81 are removed, so as to expose a surface of the passivation layer 212 at a side away from the piezoelectric layer 100. Referring to FIG. 13 and FIG. 14, a patterning process (for example, including a photolithography process and an etching process) is performed on the passivation layer 212 and the second electrode layer 210 to remove a portion of the passivation layer 212 and a portion of the second electrode layer 210, so that a second electrode E2 is formed, and the passivation layer 212 correspondingly covers a surface of the second electrode E2 at a side away from the piezoelectric layer. In this step, a sidewall of the passivation layer 212 may be substantially aligned with a sidewall of the second electrode E2 in a direction perpendicular to the main surface of the piezoelectric layer.

In some embodiments, the patterning process includes: forming a passivation opening 212h1 in the passivation layer 212, and forming an electrode via hole 210h in the second electrode layer 210, wherein the passivation opening 212h1 and the electrode via hole 212h are in spatial communication with each other, and the electrode via hole 210h extends to pass through the second electrode E2 and exposes a sidewall of the second electrode E2 and a portion of the surface of the piezoelectric layer 100 away from the first electrode layer 110. The electrode via hole 210h and the passivation opening 212h1 are at least partially located directly above the additional electrode AE1, that is, orthographic projections of the electrode via hole 210h and the passivation opening 212h1 on the main surface of the piezoelectric layer 100 are at least partially overlapped with an orthographic projection of the additional electrode AE1 on the main surface of the piezoelectric layer.

Figure 15:
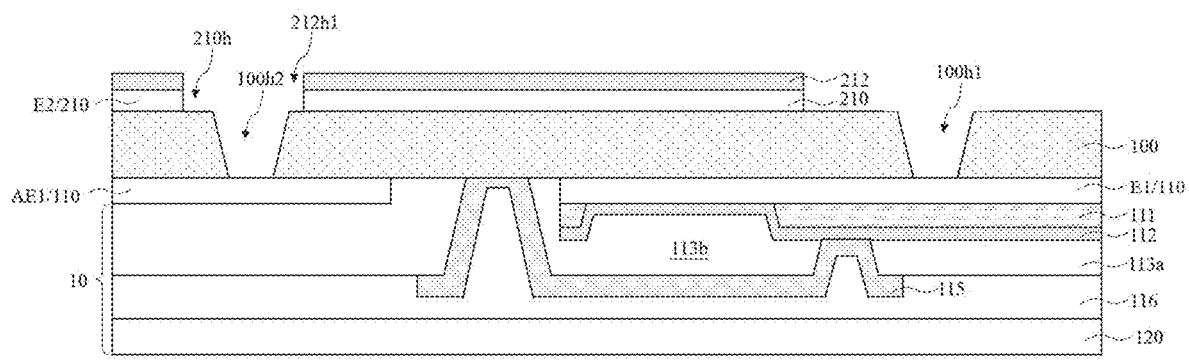

Referring to FIG. 14 and FIG. 15, an etching process is performed on the piezoelectric layer 100 to remove portions of the piezoelectric layer exposed by the second electrode layer 210 and the passivation layer 212, and to form a piezoelectric via hole 100h1 and an additional piezoelectric via hole 100h2 which extend through the piezoelectric layer 100, in the piezoelectric layer 100. For example, the piezoelectric via hole 100h1 exposes a portion of the surface of the first electrode E1 at a side away from the carrier substrate 120; the additional piezoelectric via hole 100h2 is in spatial communication with the electrode via hole 210h, and exposes a portion of the surface of the additional electrode AE1 at a side away from the carrier substrate 120. In some embodiments, the etching process further forms one or more release holes (not shown) in the piezoelectric layer 100, wherein the release hole extends through the piezoelectric layer 100 to exposes a portion of the surface of the sacrificial dielectric layer 113b at a side away from the carrier substrate 120. For example, the etching process removes a portion of the piezoelectric layer located directly above the sacrificial dielectric layer 113b, thereby forming the release hole. It should be noted that the release hole only exposes a portion of the surface of the sacrificial dielectric layer 113b, and does not expose the first electrode layer 110, the cavity boundary layer 115, and the supporting dielectric layer 113a, etc.

Figure 16:
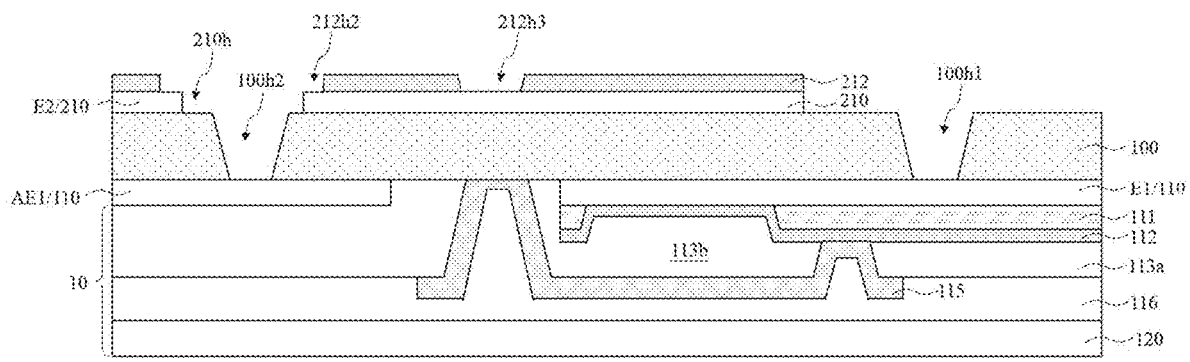

Referring to FIG. 15 and FIG. 16, in some embodiments, an etching process is further performed on the passivation layer 212 to remove a portion of the passivation layer 212 covering the second electrode E2, and form a passivation opening 212h2 and a passivation opening 212h3 in the passivation layer 212. For example, a portion of the passivation layer around the passivation opening 212h1 shown in FIG. 15 is removed, so that a size of the passivation opening 212h1 is further increased, thereby forming the passivation opening 212h2; the passivation opening 212h2 is in spatial communication with the electrode via hole 210h and the additional piezoelectric via hole 100h2, and exposes a portion of the surface of the second electrode E2 at a side away from the piezoelectric layer. A position of the passivation opening 212h3 is offset from a position of the electrode via hole 210h in a direction parallel to the main surface of the piezoelectric layer, that is, an orthographic projection of the passivation opening 212h3 on the piezoelectric layer is offset from an orthographic projection of the electrode via hole 210h on the piezoelectric layer. The passivation opening 212h3 extends through the passivation layer 212, and exposes a portion of the surface of the second electrode E2 at a side away from the piezoelectric layer 100.

Figure 17:
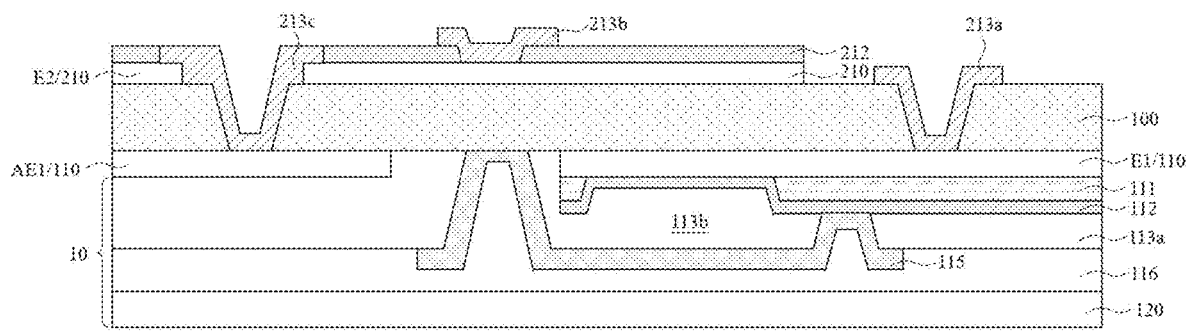

Referring to FIG. 16 and FIG. 17, one or more conductive pads are formed on a side of the piezoelectric layer 100 away from the carrier substrate 120; for example, a first conductive pad 213a, an interconnection pad 213c and a second conductive pad 213b may be formed. For example, a conductive material layer may be formed on a side of the piezoelectric layer 100, the second electrode layer 210 and the passivation layer 212 away from the carrier substrate 120 by deposition, and the conductive material layer is filled in each of the piezoelectric via holes, electrode via hole and passivation openings; then a patterning process including etching is performed on the conductive material layer, thereby forming the one or more conductive pads.

Figure 18:
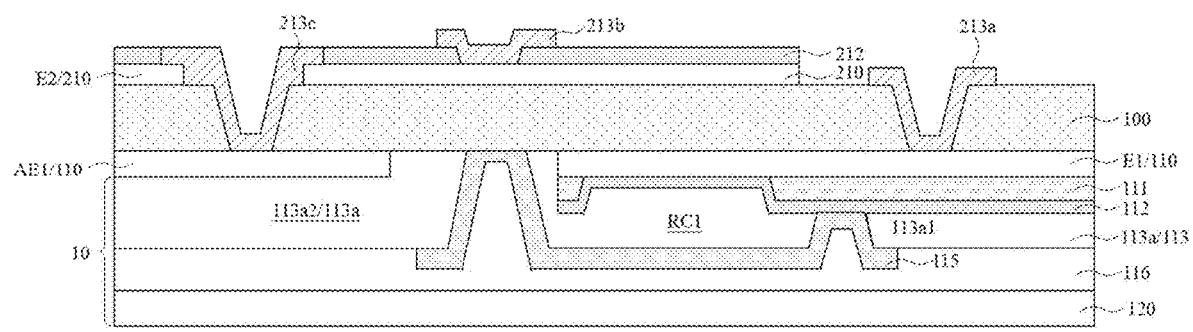

Referring to FIG. 17 and FIG. 18, the sacrificial dielectric layer 113b is removed to form a first cavity RC1. For example, the sacrificial dielectric layer 113b may be removed by an etching process, and the etching process may include: applying an etchant to a region where the sacrificial dielectric layer 113b is located through release hole(s) in the piezoelectric layer 100, thereby removing the sacrificial dielectric layer 113b and forming the first cavity RC1 at a position previously occupied by the sacrificial dielectric layer 113b. The etchant may include, for example, a buffer oxide etchant (BOE) or hydrofluoric acid (for example, diluted hydrofluoric acid (DHF) or the like. The buffer oxide etchant is a mixed solution of hydrofluoric acid (HF) and $NH_4F$. The etching process has a high etching selectivity of the sacrificial dielectric layer 113b to adjacent components such as the cavity boundary layer 115, and substantially does not remove the cavity boundary layer 115, the first electrode E1, the edge protruding layer 111 and the passivation layer 112, thereby defining the first cavity RC1 in a region surrounded by the cavity boundary layer 115 and the components above the cavity boundary layer 115. In addition, since the sacrificial dielectric layer 113b is spaced apart from the supporting dielectric layer 113a by the cavity boundary layer 115, and the cavity boundary layer 115 confines the etchant in a region where the sacrificial dielectric layer 113b is located, thus the supporting dielectric layer 113a is substantially not removed in the etching process.

Referring to FIG. 18, after the sacrificial dielectric layer 113b is removed, the dielectric layer 113 only includes the supporting dielectric layer 113a; the supporting dielectric layer 113a includes a first dielectric part 113a1 located between the carrier bonding layer 116 and the passivation layer 112, and a second dielectric part 113a2 located between the carrier bonding layer 116 and the additional electrode AE1 and between the carrier bonding layer 116 and the piezoelectric layer 100. The supporting dielectric layer 113a, the cavity boundary layer 115, the carrier bonding layer 116 and the carrier substrate 120 together constitute the carrier structure 10.

Figure 19:
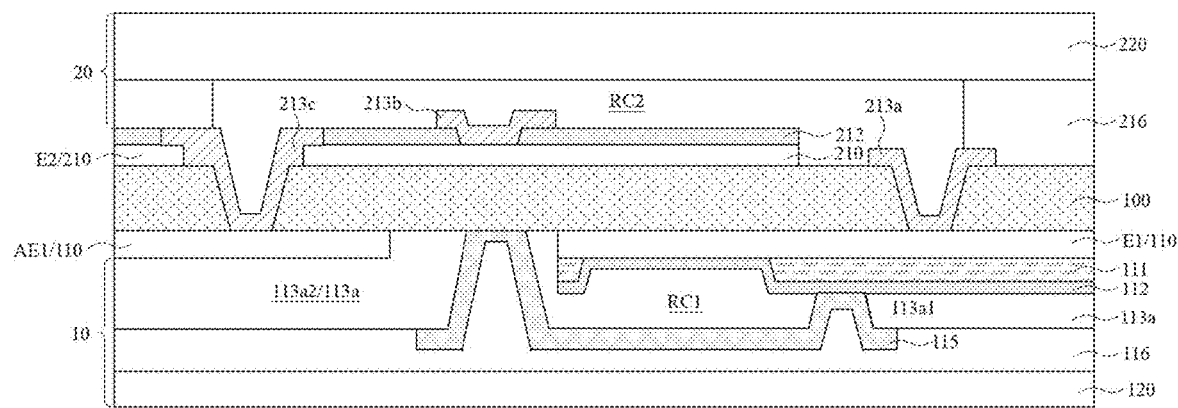

Referring to FIG. 18 and FIG. 19, a cover structure 20 is formed and bonded to a structure shown in FIG. 18, such that the cover structure 20 and the structure shown in FIG. 18 enclose to delimit a second cavity RC2. For example, the formation of the cover structure 20 may include providing a cover substrate 220 and forming a cover bonding layer 216 on the cover substrate 220. For example, a material of the cover substrate 220 may be as same as or different from that of the carrier substrate 120. For example, the material of the cover substrate 220 may be or include a semiconductor material, an insulating material, such as high-resistance silicon, glass, or the like. For example, the cover substrate 220 may be a wafer, such as a semiconductor wafer such as a silicon wafer. The cover bonding layer 216 may include an organic material, such as a dry film, a photoresist material or the like.

In some embodiments, forming the cover bonding layer 216 on the cover substrate 220 may include: depositing and forming a bonding material layer on the cover substrate 220, and then performing a patterning process on the bonding material layer to remove a portion of the bonding material layer and to form the cover bonding layer 216. In some embodiments, because the cover bonding layer 216 is formed of dry film or photoresist material, the patterning process for forming the cover bonding layer 216 can be realized by using a photolithography process including exposure and development, and the patterning process may not require an etching process. In some embodiments, the cover bonding layer 216 may be disposed on an edge portion of the cover substrate 220 and may be ring-shaped.

After the cover bonding layer 216 is formed on the cover substrate 220, a side of the cover substrate 220 provided with the cover bonding layer 216 is positioned to face the structure shown in FIG. 18, and a bonding process is then performed to bond the cover structure 20 to the structure shown in FIG. 18. In some embodiments, the process of bonding the cover bonding layer 216 to the underlying structure (that is, the structure shown in FIG. 18) is performed after the cover bonding layer 216 is patterned, a bonding surface of the underlying structure may have an uneven morphology, and a bonding interface between the cover bonding layer 216 and the underlying structure has a relatively small area, therefore, using a relatively soft organic material such as a dry film or photoresist or the like for the cover bonding layer 216 can facilitate the bonding process and allow the structure formed by the bonding process to have higher stability and reliability.

Still referring to FIG. 18 and FIG. 19, in some embodiments, before bonding the cover structure 20 to the second side of the piezoelectric layer 100, the wafer structure may further be tested through the test pads. For example, the first conductive pad 213a electrically connected to the first electrode E1 and the second conductive pad 213b electrically connected to the second electrode E2 can be used for the test of the wafer structure. The test may include a wafer acceptance test (WAT), but the present disclosure is not limited thereto. In some embodiments, the test may include a test of related performances (e.g., frequency, etc.) of the resonator, and related structural parameters (e.g., thickness, etc.) of the resonator may be adjusted based on test results, so that the subsequently formed resonator can satisfy the expected requirements. In the present disclosure, the wafer structure includes a wafer and various components formed on the wafer.

Figure 20:
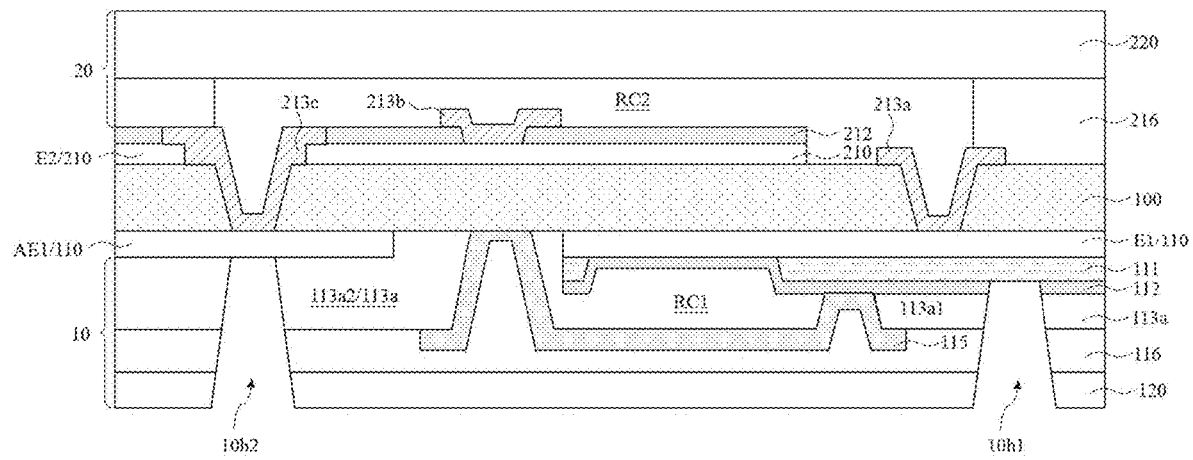

Referring to FIG. 19 and FIG. 20, an etching process is performed on the carrier structure 10 and the passivation layer 112 to form a first connection via hole 10h1 and a second connection via hole 10h2. For example, the etching process removes a portion of the carrier substrate 120, a portion of the carrier bonding layer 116, a portion of the first dielectric part 113a1 of the supporting dielectric layer 113a, and a portion of the passivation layer 112, thereby forming the first connection via hole 10h1 to expose a portion of the surface of the first electrode structure ES1 (e.g., the edge protruding layer 111) at a side away from the piezoelectric layer 100; the etching process removes a portion of the carrier substrate 120, a portion of the carrier bonding layer 116 and a portion of the second dielectric part 113a2 of the supporting dielectric layer 113a, thereby forming the second connection via hole 10h2 to expose a portion of the surface of the additional electrode AE1 at a side away from the piezoelectric layer 100.

Figure 21:
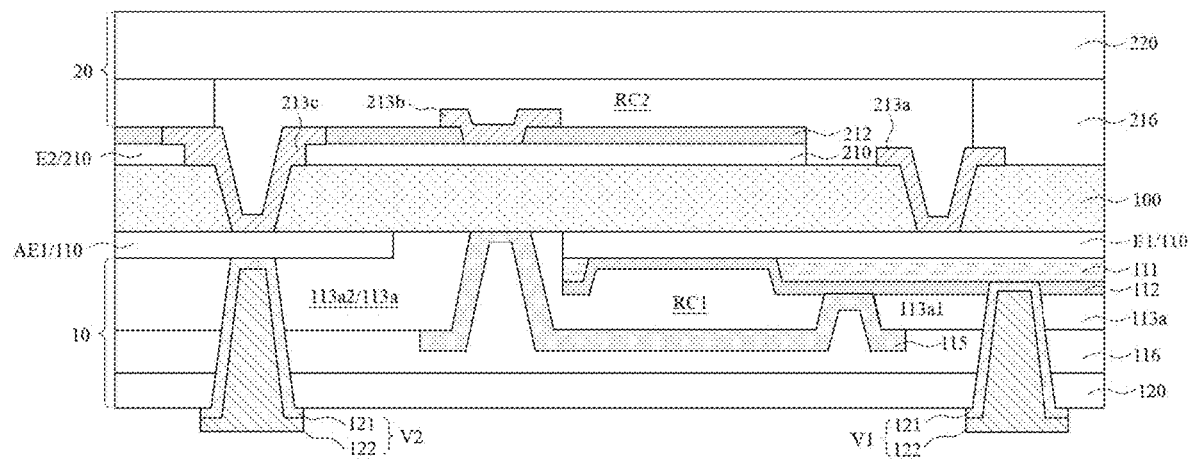

Referring to FIG. 20 and FIG. 21, a first conductive via V1 and a second conductive via V2 are formed. The first conductive via V1 and the second conductive via V2 at least fill into the first connection via hole 10h1 and the second connection via hole 10h2 to be connected to the first electrode E1 and the additional electrode AE1, respectively. In some embodiments, each of the first conductive via V1 and the second conductive via V2 includes a via part located in a via hole of the carrier structure and a protrusion part (or may be referred to as a pad part), the protrusion part is protruded, in the first direction D1, from a surface of the carrier substrate 120 at a side away from the piezoelectric layer, towards a direction away from the piezoelectric layer 100. A width of the protrusion part in a direction parallel to the main surface of the piezoelectric layer may be greater than a width of the via part in the said direction, and the protrusion part may cover a portion of the surface of the carrier substrate 120 at a side away from the piezoelectric layer.

Still referring to FIG. 20 and FIG. 21, in some embodiments, the first conductive via V1 and the second conductive via V2 may be formed by the following processes: a seed material layer is formed on a side of the carrier structure 10 away from the piezoelectric layer, wherein the seed material layer covers a surface of the carrier substrate 120 at a side away from the piezoelectric layer, fills in the first connection via hole and the second connection via hole and lines surfaces of the first connection via hole and the second connection via hole, and wherein the seed material layer may be a metal seed layer, for example, may include titanium, copper or a combination thereof, or the like; a mask layer (for example, a patterned photoresist layer) is performed on a side of the seed material layer away from the piezoelectric layer, wherein the mask layer has mask openings corresponding to positions where the first conductive via and the second conductive via are to be formed, for example, the mask openings may expose portions of the seed material layer located in the first connection via hole and the second connection via hole, and may further exposes some other portions of the seed material layer which are adjacent to the portions of the seed material layer and located on a side of the carrier substrate 120 away from the piezoelectric layer; thereafter, a conductive layer 122 is formed on the seed material layer exposed by the mask openings of the mask layer by a plating process (for example, an electroplating process), wherein the conductive layer 122 may include a metal material such as copper; the mask layer is then removed, and an etching process is performed on the seed material layer using the conductive layer 122 as an etching mask, so as to remove a portion of the seed material layer not covered by the conductive layer 122, and a seed layer 121 is remained, so that the seed layer 121 and the conductive layer 122 together constitute a corresponding conductive via.

Figure 22:
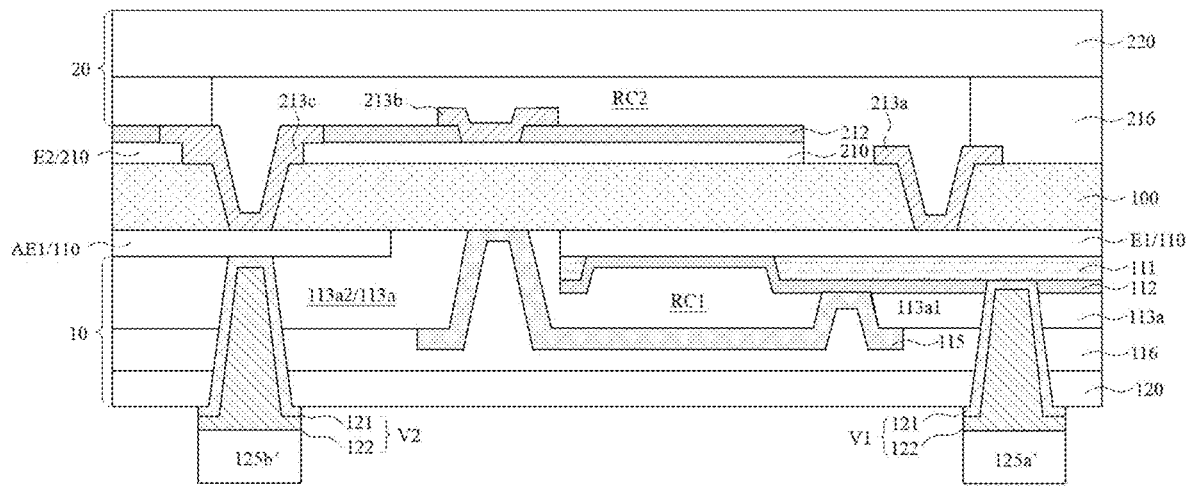
Figure 23:
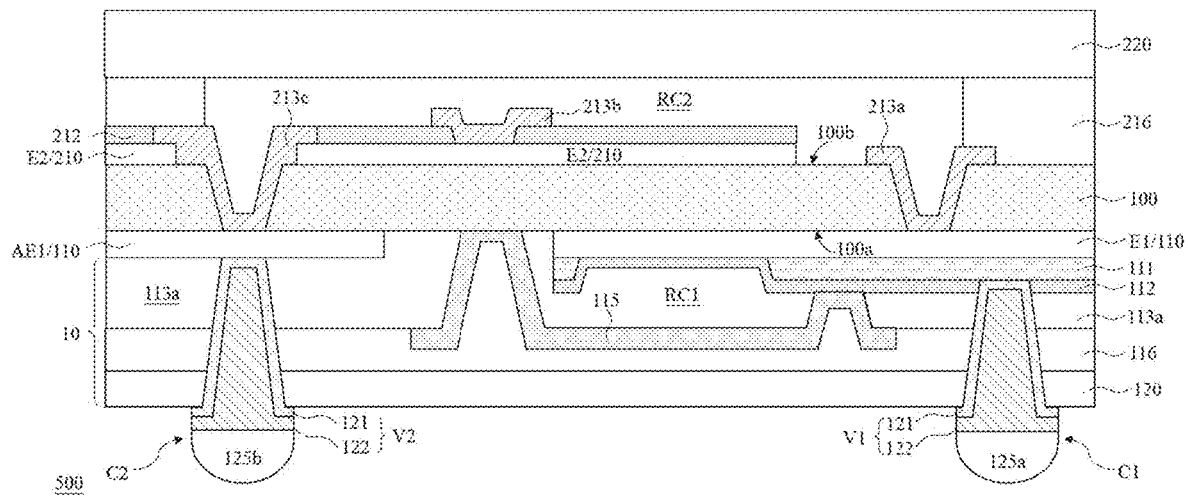

Referring to FIG. 22 and FIG. 23, a first conductive bump 125a and a second conductive bump 125b are respectively formed on a side of the first conductive via V1 and the second conductive via V2 away from the piezoelectric layer. The conductive bump may be or include a solder bump. In some embodiments, the conductive bump may be formed by forming a bump material on the conductive via and performing a reflow process on the bump material. For example, as shown in FIG. 22, a first bump material 125a' and a second bump material 125b' are respectively formed on a side of the first conductive via V1 and the second conductive via V2 away from the piezoelectric layer; the first bump material and the second bump material may be or include solder paste, and may be formed on the corresponding conductive vias by a printing process, for example; in this step, a cross-sectional shape of the bump material may be square or similar shapes. Thereafter, as shown in FIG. 22 and FIG. 23, a reflow process is performed on the first bump material 125a' and the second bump material 125b' to form the first conductive bump 125a and the second conductive bump 125b; after the reflow process, the conductive bump may have a spherical-shaped or similar-shaped surface; for example, the conductive bump may also be referred to as a solder ball.

Referring to FIG. 23, as such, the manufacturing process of the resonator 500 is thus completed. In some embodiments, the manufacturing process of the resonator 500 adopts a wafer-level packaging process, and a packaging structure as formed includes a plurality of dies, and each of the dies may include one or more resonators 500. It should be understood that, FIG. 2 to FIG. 23 merely illustrate cross-sectional views of structures in a region corresponding to a single resonator in various steps in the packaging process, and other resonators located in the same die or different dies in the overall packaging structure are simultaneously formed by similar or substantially the same steps and may have similar or substantially the same structures as the illustrated resonator. In some embodiments, after a plurality of conductive bumps are formed, a cutting process may be performed on the formed wafer-level packaging structure to separate the plurality of dies from each other, so that the plurality of dies are independent of each other and each include one or more resonators 500. For example, the die may include a filter including a plurality of resonators.

The embodiments of the present disclosure provide a filter including a plurality of resonators, the plurality of resonators may be connected to each other in a series and/or parallel manner. The filter also has the technical effects described above with respect to the resonator. In some embodiments, the resonators in the filter may each have a structure as same as or similar to the resonator 500, and may be connected to each other through conductive wires. For example, the process step of performing the patterning process on the first electrode layer 110 in FIG. 6, not only include forming first electrodes and additional electrodes of a plurality of resonators, but may also include forming conductive wires for connecting the first electrodes of the corresponding resonators; the process step of performing the patterning process on the second electrode layer 210 in FIG. 14, not only include forming second electrodes of a plurality of resonators, but may also include forming conductive wires for connecting the second electrodes of the corresponding resonators.

In some embodiments, for a plurality of resonators connected to each other (e.g., in series) in a filter, it may be unnecessary to provide conductive connectors and test pads in each of the resonators. For example, one of the plurality of resonators (e.g., a first resonator) may be selected to be provided with conductive connectors, and the first resonator may not be provided with test pads; and another one of the plurality of resonators (e.g., a second resonator) may be selected to be provided with test pads, and the second resonator may not be provided with conductive connectors as well as an additional pad and an additional electrode for electrical connection between a second conductive connector and a second electrode. Because the plurality of resonators are connected in series with each other, voltages can be applied to the corresponding electrodes of the plurality of resonators through the conductive connectors in the first resonator; and the filter including the plurality of resonators can be tested through the test pads of the second resonator.

Figure 24:
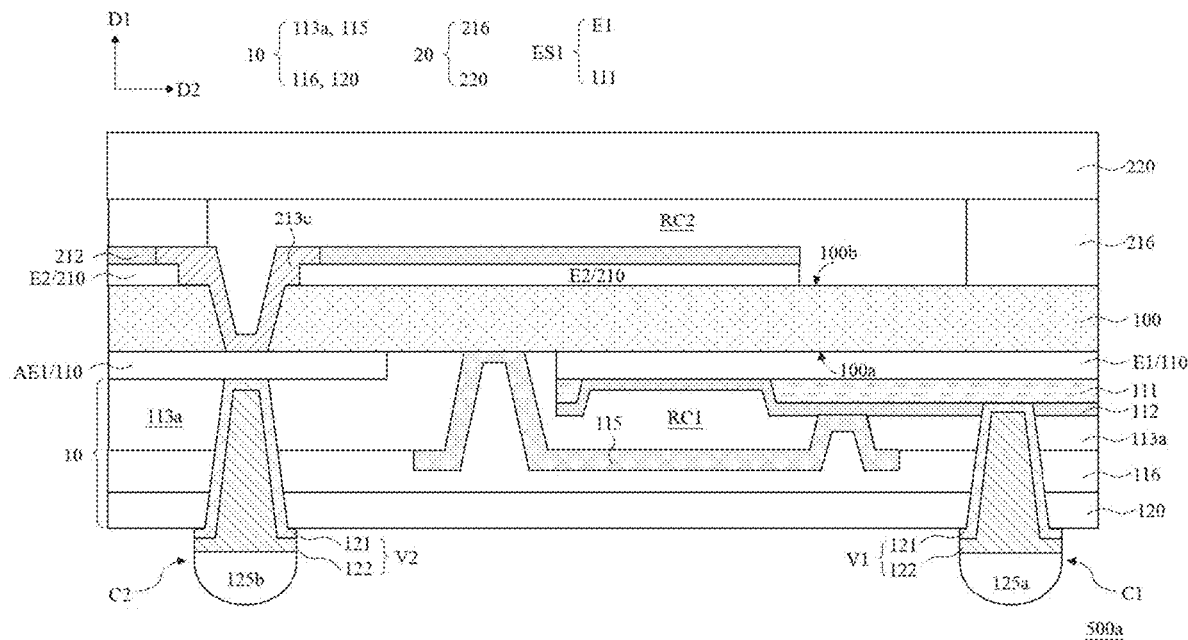
FIG. 24 illustrates a schematic cross-sectional view of a bulk acoustic wave resonator according to some other embodiments of the present disclosure.
Figure 25:
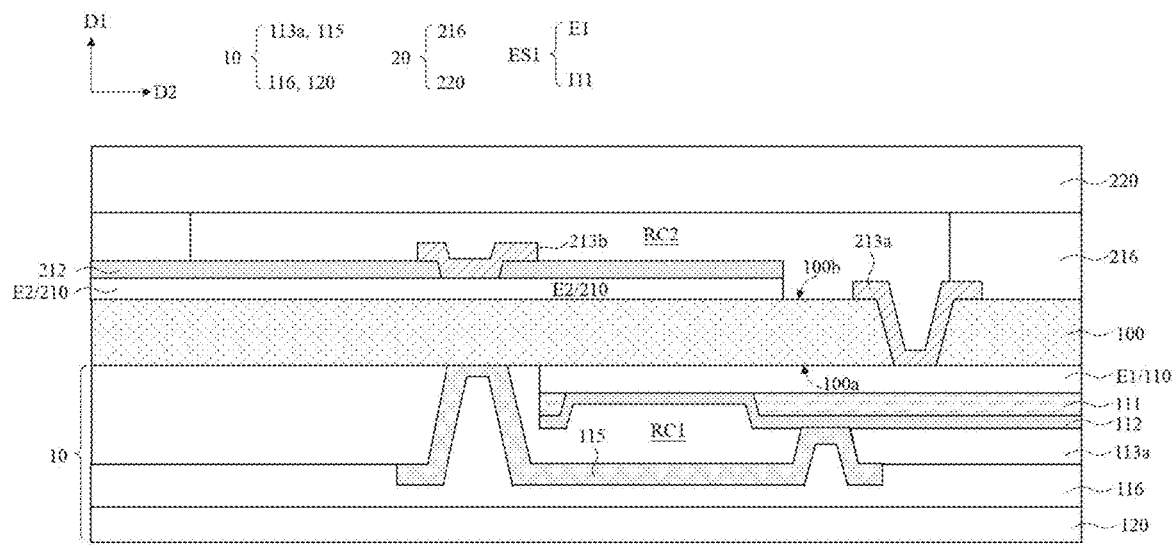
FIG. 25 illustrates a schematic cross-sectional view of a bulk acoustic wave resonator according to some further embodiments of the present disclosure.

FIG. 24 and FIG. 25 schematically illustrate a first resonator 500a and a second resonator 500b included in the filter. For example, the first resonator 500a and the second resonator 500b may be connected in series with each other, and a structure of the first resonator 500a is similar to that of the resonator 500 shown in FIG. 23, except that the first conductive pad and the second conductive pad are omitted in the first resonator 500a. A structure of the second resonator 500b is similar to that of the resonator 500 shown in FIG. 23, except that the first conductive connector and the second conductive connector, as well as the additional electrode and the interconnection pad connected to the second conductive connector are omitted in the second resonator 500b. In the filter, the corresponding electrodes in the first resonator 500a and the second resonator 500b may be connected to each other through conductive wires provided in the corresponding electrode layers.

It should be understood that, the connection modes and structures of the first resonator and the second resonator shown in FIGS. 24 and 25 are merely for illustration; in practical application, the specific structures of the respective resonators can be appropriately adjusted based on the structure of the resonator 500 according to the product requirements, such as the connection mode of the respective resonators in the filter, and structures including these adjustments are also included in the scope of protection of the present disclosure.

In the embodiments of the present disclosure, through disposing the conductive connectors and the cover structure of the resonator on different sides of the piezoelectric layer, problems such as delamination, bump fracture, etc., caused by the cover bonding layer can be avoided or reduced, and hence the device reliability of the resonator and the filter can be improved. In addition, the first and second conductive pads located on the second side of the piezoelectric layer are only used as test pads, so it is unnecessary to consider their influence on the resistance, and the thickness of these conductive pads can be disposed to be relatively small, thereby reducing the cost. On the other hand, as compared with the resonator in which the conductive bumps are electrically connected to the corresponding electrodes by redistribution layer(s), in the embodiments of the disclosure, the conductive bumps are directly electrically connected to the corresponding electrodes through the conductive vias, thus the manufacturing process of the resonator in the embodiments of the present disclosure can reduce the number of the masks, thereby simplifying the process and saving the cost.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:
1. A bulk acoustic wave resonator, comprising:
 a piezoelectric layer, having a first side and a second side opposite to each other in a first direction;
 a first electrode layer, disposed on the first side of the piezoelectric layer and comprising a first electrode and an additional electrode electrically isolated from each other;

a second electrode layer, disposed on the second side of the piezoelectric layer and comprising a second electrode;

one or more conductive pads, disposed on the second side of the piezoelectric layer and at least comprising an interconnection pad, wherein the interconnection pad is electrically connected to the second electrode and extends through the second electrode and the piezoelectric layer to be electrically connected to the additional electrode;

a carrier structure, disposed on the first side of the piezoelectric layer and a side of the first electrode layer away from the second electrode layer, wherein a first cavity is disposed between the carrier structure and the piezoelectric layer, and a portion of the first electrode is located in the first cavity;

a cover structure, disposed on the second side of the piezoelectric layer and comprising a cover bonding layer and a cover substrate, wherein the cover bonding layer is disposed between the cover substrate and the piezoelectric layer in the first direction, wherein a second cavity is disposed between the cover structure and the piezoelectric layer, and a portion of the second electrode layer is located in the second cavity; and a first conductive connector and a second conductive connector, disposed on the first side of the piezoelectric layer away from the cover structure, wherein the first conductive connector extends through the carrier structure to be electrically connected to the first electrode, wherein the second conductive connector extends through the carrier structure to be electrically connected to the additional electrode, and further electrically connected to the second electrode through the additional electrode and the interconnection pad, wherein the cover bonding layer is bonded to portions of surfaces of the piezoelectric layer and the one or more conductive pads, and a part of the one or more conductive pads has an embedded portion, the embedded portion is covered by the cover bonding layer.

2. The bulk acoustic wave resonator according to claim 1, wherein the second electrode has an electrode via hole, the piezoelectric layer has an additional piezoelectric via hole, and the electrode via hole and the additional piezoelectric via hole are in spatial communication with each other to expose a portion of a surface of the additional electrode at a side close to the piezoelectric layer, and the interconnection pad is electrically connected to the additional electrode through the electrode via hole and the additional piezoelectric via hole.

3. The bulk acoustic wave resonator according to claim 2, wherein the one or more conductive pads further comprise at least one of a first conductive pad and a second conductive pad;

the first conductive pad is disposed on a surface of the second side of the piezoelectric layer and electrically connected to the first electrode through a piezoelectric via hole in the piezoelectric layer; and the second conductive pad is disposed on a side of the second electrode away from the piezoelectric layer and electrically connected to the second electrode.

4. The bulk acoustic wave resonator according to claim 3, wherein the first conductive pad and the second conductive pad are used as test pads.

5. The bulk acoustic wave resonator according to claim 1, wherein a contact area between the embedded portion and the cover bonding layer is greater than or equal to an area of a surface of the embedded portion at a side away from the piezoelectric layer.

6. The bulk acoustic wave resonator according to claim 1, wherein there is free of a conductive component disposed in the cover bonding layer and electrically connected to the embedded portion of the part of the one or more conductive pads.

7. The bulk acoustic wave resonator according to claim 1, wherein a portion of the carrier structure is located between the first electrode and the additional electrode in a second direction parallel to a main surface of the piezoelectric layer, and the additional electrode is located on a side of the portion of the carrier structure away from the first cavity in the second direction and is spaced apart from the first cavity.

8. The bulk acoustic wave resonator according to claim 1, wherein the carrier structure comprises:

a supporting dielectric layer, disposed on a side of the first electrode layer away from the piezoelectric layer, and a portion of the supporting dielectric layer is located between the first electrode and the additional electrode in a second direction parallel to a main surface of the piezoelectric layer;

a carrier bonding layer, disposed on a side of the supporting dielectric layer away from the piezoelectric layer;

a cavity boundary layer, located between the supporting dielectric layer and the carrier bonding layer, and located on a side of the carrier bonding layer close to the first cavity, wherein the cavity boundary layer delimits a portion of a boundary of the first cavity; and a carrier substrate, located on a side of the carrier bonding layer away from the piezoelectric layer.

9. The bulk acoustic wave resonator according to claim 8, wherein a portion of the supporting dielectric layer and a portion of the carrier bonding layer are spaced apart from each other by the cavity boundary layer; and the supporting dielectric layer and the carrier bonding layer have portions that are in contact with each other.

10. The bulk acoustic wave resonator according to claim 9, wherein the carrier substrate and the portions that are in contact with each other of the supporting dielectric layer and the carrier bonding layer have a first connection via hole and a second connection via hole disposed therein; and the first conductive connector is electrically connected to the first electrode through the first connection via hole, and the second conductive connector is electrically connected to the additional electrode through the second connection via hole.

11. The bulk acoustic wave resonator according to claim 8, wherein the supporting dielectric layer comprises:

a first dielectric part, located between the first electrode and the carrier bonding layer in the first direction; and a second dielectric part, located between the additional electrode and the carrier bonding layer in the first direction, wherein a thickness of the second dielectric part in the first direction is greater than a thickness of the first dielectric part in the first direction.

12. The bulk acoustic wave resonator according to claim 11, further comprising: a passivation layer, wherein a portion of the passivation layer is located between the first electrode and the first dielectric part, and the first electrode is spaced apart from the first dielectric part by the passivation layer, wherein the additional electrode is in direct contact with the second dielectric part.

13. The bulk acoustic wave resonator according to claim 8, wherein the carrier bonding layer comprises:
  a bonding body, located on a side of the supporting dielectric layer away from the piezoelectric layer in the first direction; and
  a bonding protrusion, protruded in the first direction, from a surface of the bonding body at a side away from the carrier substrate towards the piezoelectric layer, wherein the first cavity is surrounded by the bonding protrusion, and the bonding body comprises a first body part and a second body part; an orthographic projection of the first body part on the main surface of the piezoelectric layer overlaps with an orthographic projection of the first cavity on the main surface of the piezoelectric layer, and the second body part is located on a side of the bonding protrusion away from the first cavity in the second direction.

14. The bulk acoustic wave resonator according to claim 13, wherein the cavity boundary layer covers a sidewall of the bonding protrusion and surfaces of the bonding protrusion and the first body part at a side close to the piezoelectric layer, and the bonding protrusion is spaced apart from the supporting dielectric layer by the cavity boundary layer.

15. The bulk acoustic wave resonator according to claim 14, wherein the supporting dielectric layer is located on a side of the bonding protrusion and a portion of the cavity boundary layer covering the bonding protrusion away from the first cavity in a direction parallel to the main surface of the piezoelectric layer, and the supporting dielectric layer is in contact with the second body part.

16. The bulk acoustic wave resonator according to claim 8, wherein a material of the carrier bonding layer is different from a material of the cover bonding layer; or
  the carrier bonding layer comprises an inorganic material, and the cover bonding layer comprises an organic material.

17. The bulk acoustic wave resonator according to claim 1, wherein
  the first conductive connector comprises a first conductive via and a first conductive bump connected with each other, and the second conductive connector comprises a second conductive via and a second conductive bump connected with each other; at least a portion of the first conductive via and at least a portion of the second conductive via are embedded in the carrier structure; the first conductive bump is electrically connected to the first electrode through the first conductive via, and the second conductive bump is electrically connected to the additional electrode through the second conductive via.

18. A method for manufacturing a bulk acoustic wave resonator, comprising:
  sequentially forming a second electrode layer, a piezoelectric layer and a first electrode layer, wherein the first electrode layer and the second electrode layer are respectively located on a first side and a second side of the piezoelectric layer opposite to each other in a first direction;
  performing a patterning process on the first electrode layer to form a first electrode and an additional electrode, and forming a gap between the first electrode and the additional electrode, so that the first electrode and the additional electrode are spaced apart from each other and electrically isolated from each other;
  forming a carrier structure on the first side of the piezoelectric layer and a side of the first electrode layer away from the second electrode layer, with a portion of the carrier structure being filled in the gap, and forming a first cavity between the piezoelectric layer and the carrier structure, with a portion of the first electrode being located in the first cavity;
  performing a patterning process on the second electrode layer to form a second electrode;
  forming one or more conductive pads on the second side of the piezoelectric layer, wherein the one or more conductive pads at least comprise an interconnection pad, the interconnection pad is electrically connected to the second electrode, and extends through the second electrode and the piezoelectric layer to be electrically connected to the additional electrode;
  bonding a cover structure to the second side of the piezoelectric layer, and forming a second cavity between the cover structure and the piezoelectric layer, wherein the cover structure comprises a cover bonding layer and a cover substrate, the cover bonding layer is disposed between the cover substrate and the piezoelectric layer in the first direction, and a portion of the second electrode layer is located in the second cavity;
  forming a first connection via hole and a second connection via hole extending through the carrier structure; and
  forming a first conductive connector and a second conductive connector on a side of the piezoelectric layer away from the cover structure, wherein the first conductive connector is electrically connected to the first electrode through the first connection via hole, the second conductive connector is electrically connected to the additional electrode through the second connection via hole, and the further electrically connected to the second electrode through the additional electrode and the interconnection pad,
  wherein the cover bonding layer is bonded to portions of surfaces of the piezoelectric layer and the one or more conductive pads, and a part of the one or more conductive pads has an embedded portion, the embedded portion is covered by the cover bonding layer.

19. The method for manufacturing the bulk acoustic wave resonator according to claim 18, wherein forming the carrier structure comprises:
  forming a dielectric layer on a side of the first electrode layer and the piezoelectric layer away from the second electrode layer, wherein the dielectric layer is filled in the gap between the first electrode and the additional electrode;
  performing a patterning process on the dielectric layer to form a trench in the dielectric layer, and a sacrificial dielectric layer and a supporting dielectric layer spaced apart from each other by the trench are formed;
  forming a cavity boundary layer on a side of the dielectric layer away from the piezoelectric layer, wherein the cavity boundary layer is filled in the trench and covers a surface of the trench;
  removing a portion of the cavity boundary layer located on a side of the supporting dielectric layer away from the piezoelectric layer;
  forming a carrier bonding layer on a side of the dielectric layer and the cavity boundary layer away from the piezoelectric layer; and
  bonding a carrier substrate to the carrier bonding layer.

20. The method for manufacturing the bulk acoustic wave resonator according to claim 18, wherein
  performing the patterning process on the second electrode layer comprises forming an electrode via hole in the second electrode;

after performing the patterning process on the second electrode layer and before forming the one or more conductive pads, the method further comprises: removing a portion of the piezoelectric layer to form an additional piezoelectric via hole in the piezoelectric layer to expose a portion of a surface of the additional electrode, wherein the additional piezoelectric via hole is in spatial communication with the electrode via hole;

the interconnection pad is electrically connected to the additional electrode through the electrode via hole and the additional piezoelectric via hole.

\* \* \* \* \*